(12) United States Patent
Nakatsuka

(10) Patent No.: US 6,732,334 B2
(45) Date of Patent: May 4, 2004

(54) ANALOG MOS SEMICONDUCTOR DEVICE, MANUFACTURING METHOD THEREFOR, MANUFACTURING PROGRAM THEREFOR, AND PROGRAM DEVICE THEREFOR

(75) Inventor: Junji Nakatsuka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/106,490

(22) Filed: Mar. 27, 2002

(65) Prior Publication Data

US 2002/0190279 A1 Dec. 19, 2002

(30) Foreign Application Priority Data

Apr. 2, 2001 (JP) ........................................ 2001-103232

(51) Int. Cl.[7] ............................................. G06F 17/50
(52) U.S. Cl. ............................................. 716/1; 716/11
(58) Field of Search ................................ 716/1–2, 8–11

(56) References Cited

U.S. PATENT DOCUMENTS

| | | | | |
|---|---|---|---|---|
| 4,636,825 A | * | 1/1987 | Baynes ........................ | 257/401 |
| 5,492,857 A | * | 2/1996 | Reedy et al. ................ | 438/407 |
| 5,675,501 A | * | 10/1997 | Aoki ............................ | 716/8 |
| 5,796,671 A | * | 8/1998 | Wahlstrom ............ | 365/230.03 |
| 6,298,467 B1 | * | 10/2001 | Chuang et al. ................ | 716/2 |
| 6,405,347 B1 | * | 6/2002 | McBride ........................ | 716/4 |
| 6,493,790 B1 | * | 12/2002 | Khieu et al. ................ | 711/108 |

FOREIGN PATENT DOCUMENTS

| | | |
|---|---|---|
| JP | 6-232264 | 8/1994 |
| JP | 7-50399 | 2/1995 |
| JP | 7-161984 | 6/1995 |
| JP | 8-213577 | 8/1996 |
| JP | 2000-36582 | 2/2000 |
| JP | 2000-155620 A | 6/2000 |
| JP | 2000-243841 A | 9/2000 |

OTHER PUBLICATIONS

Gregorian, et al "Analog MOS Integrated Circuits For Signal Processing" Copyright 1986 by John Wiley & Sons, Inc., pp. 208–211.

* cited by examiner

Primary Examiner—Matthew Smith
Assistant Examiner—Paul Dinh
(74) Attorney, Agent, or Firm—McDermott, Will & Emery

(57) ABSTRACT

In an analog MOS semiconductor device, each of a plurality of MOS transistors includes a plurality of micro-unit transistors. In this way, even if a process error occurs in a transistor, a systematic offset voltage and a random offset voltage are suppressed to low levels. The micro-unit transistor has a channel width that is obtained by dividing, by an integer, a smallest channel width among those of the plurality of MOS transistors. Each micro-unit transistor includes two small transistors connected in parallel to each other, including a shared drain located in a central position, gates located on opposite sides of the drain, and sources located respectively on the outer side of the gates, i.e., at opposite ends of the micro-unit transistor.

17 Claims, 21 Drawing Sheets

ANALOG MOS SEMICONDUCTOR DEVICE, MANUFACTURING METHOD THEREFOR, MANUFACTURING PROGRAM THEREFOR, AND PROGRAM DEVICE THEREFOR

BACKGROUND OF THE INVENTION

The present invention relates to an analog MOS semiconductor device, such as an operational amplifier, a comparator, an analog switch, a sense amplifier for a memory, a low noise amplifier, or a mixer, including a MOS transistor, a capacitor, a resistor, an inductor, a diode, etc., and also relates to a method for manufacturing the same.

In recent years, along with the development in the system on chip technology, more and more LSIs including analog circuits and digital circuits integrated together have been developed each year. Accordingly, there is a demand for a significant reduction in the development time and the number of development steps and for improving the performance. There is also a demand for an automated layout process for an analog MOS semiconductor circuit.

A conventional analog MOS semiconductor device will now be described. FIG. 23 illustrates a circuit configuration of an operational amplifier as an analog MOS semiconductor device. The operational amplifier illustrated in the figure includes a P-channel transistor MP1 (21), a P-channel transistor MP2 (22), a P-channel transistor MP5 (25), a P-channel transistor MP6 (26), an N-channel transistor MN3 (23), an N-channel transistor MN4 (24), an N-channel transistor MN7 (27), a capacitor Cc (28), and a resistor Rc (29). The operational amplifier also includes a positive side input terminal V+ (30), a negative side input terminal V− (31), an output terminal Vo (32), a bias voltage input terminal VBIAS (33), a positive side power supply VDD (34), and a negative side power supply VSS (35).

Table 1 below shows the channel width W and the channel length L of each of the MOS transistors MP1 to MN7, the resistance value of the resistor Rc, and the capacitance value of the capacitor Cc of the operational amplifier of FIG. 23, as an example of the results of a design process.

TABLE 1

|  | W (μm) | L (μm) |
|---|---|---|
| MP1 | 121.20 | 1.00 |
| MP2 | 121.20 | 1.00 |
| MN3 | 28.00 | 0.50 |
| MN4 | 28.00 | 0.50 |
| MP5 | 56.00 | 0.50 |
| MP6 | 406.00 | 0.50 |
| MN7 | 406.00 | 0.50 |
| Rc | 6.84 kΩ |  |
| Cc | 3.62 pF |  |

FIG. 24 illustrates a conventional layout of the operational amplifier of FIG. 23. The size of each of the seven transistors MP1 (21) to MN7 (27) in FIG. 24 represents a layout area occupied by the transistor according to the channel width W and the channel length L thereof. This similarly applies to the capacitor Cc and the resistor Rc.

A condition for realizing systematic offset voltage SVoff=0 in a circuit design of an operational amplifier is shown by Expression (4.182) on page 210 in "Analog MOS Integrated Circuit For Signal Processing", R. Gregorian, G. C. Temes, John Wiley & Sons. Applying this expression to the operational amplifier of FIG. 23, the following expression needs to hold:

$$(W/L)MN3/(W/L)MN7$$
$$=(W/L)MN4/(W/L)MN7$$
$$=(W/L)MP5/(W/L)MP6/2 \qquad (1)$$

The channel width W and the channel length L of the transistors are determined so as to satisfy Conditional Expression (1) above.

Furthermore, a condition for realizing random offset voltage RVoff=0 in a circuit design of an operational amplifier is shown by Expression (4.185) on page 211 in the same article. Applying the expression to the operational amplifier of FIG. 23, the following expression needs to hold:

$$(W/L)MP1=(W/L)MP2 \qquad (2)$$

In the operational amplifier configuration, the P-channel transistor MP1 (21) and the P-channel transistor MP2 (22) are a pair of transistors that together form a differential input circuit.

Similarly, another condition for realizing random offset voltage RVoff=0 is shown by Expression (4.183) on page 211 in the same article. Applying the expression to the operational amplifier of FIG. 23, while taking into consideration the preconditions for the expression set forth in this article, the following expression needs to hold:

$$(W/L)MN3=(W/L)MN4 \qquad (3)$$

In the operational amplifier configuration, the N-channel transistor MN3 (23) and the N-channel transistor MN4 (24) are a pair of transistors that together form a current mirror. The value of the capacitor Cc and the value of the resistor Rc are determined so that the phase margin of the operational amplifier is satisfied as described in the article.

However, even if the channel width W and the channel length L of the seven transistors MP1 (21) to MN7 (27) are designed so as to satisfy Conditional Expression (1) for realizing systematic offset voltage SVoff=0 as described above, the value of the channel width W of each transistor may be slightly shifted from the design value due to various process errors occurring in a semiconductor manufacturing process. As a result, seven transistors that are actually obtained as described above do not satisfy Conditional Expression (1) for realizing systematic offset voltage SVoff=0, whereby a systematic offset voltage SVoff occurs. A systematic uniform shift will now be described. This shift is shown in FIG. 25 with the P-channel transistor MP5 (25) as an example.

FIG. 25 shows, on the left side, an example of a layout of the P-channel transistor MP5 (25) using the design values described above. The transistor includes a gate 7 in the central position, and a source 6 and a drain 8 arranged on the opposite sides of the gate 7. The source 6 and the drain 8 are connected to aluminum wires 9 and 9 via contacts 10. Moreover, a P-type impurity diffusion region 11 is provided for forming a channel of a P-channel transistor, and the channel width W of the P-channel transistor MP5 (25) that is drawn on the left side of the figure is designed to be equal to the width of the P-type impurity diffusion region 11.

As an example, it is assumed that a uniform process error of ΔW occurs in the decreasing direction in the semiconductor manufacturing process. FIG. 25 shows, on the right side, the manufactured P-channel transistor MP5 (25). The width of the P-type impurity diffusion region 11 of the P-channel transistor MP5 (25) that is drawn on the right side of the figure is reduced by ΔW at each end, and thus the width is reduced by 2ΔW in total. Therefore, the actual channel width W of the manufactured P-channel transistor MP5 (25) is expressed as follows:

$$(W-2\Delta W)MP5 \quad (4)$$

Similarly, the process error in the semiconductor manufacturing process occurs uniformly for other transistors of the operational amplifier illustrated in FIG. 23. Therefore, the actual channel widths W of the manufactured transistors are expressed as follows:

$$(W-2\Delta W)MN3 \quad (5)$$

$$(W-2\Delta W)MN4 \quad (6)$$

$$(W-2\Delta W)MP6 \quad (7)$$

$$(W-2\Delta W)MN7 \quad (8)$$

Therefore, substituting Expressions (3) to (8) into Expression (1) gives the following expression:

$$\{(W-2\Delta W)/L\}MN3/\{(W-2\Delta W)/L\}MN7$$
$$=\{(W-2\Delta W)/L\}MN4/\{(W-2\Delta W)/L\}MN7$$
$$\neq \{(W-2\Delta W)/L\}MP5/\{(W-2\Delta W)/L\}MP6/2 \quad (9)$$

Thus, the conditional expression for realizing systematic offset voltage SVoff=0 no longer holds. Therefore, the systematic offset voltage SVoff occurs due to various systematic process errors in the semiconductor manufacturing process.

On the other hand, the article, page 211, line 15 from the bottom to line 12 from the bottom, states that in the circuit configuration of an analog MOS semiconductor device, Conditional Expression (1) for realizing systematic offset voltage SVoff=0 can be satisfied as follows: "If ratios as large as (or larger than) two are required, then the wider transistor can be realized by the parallel connection of two (or more) "unit transistors" of the size of the narrower one". Specifically, with a transistor (first transistor) having the minimum channel width W being a unit transistor, when a second transistor having a channel width kW (k is an integer) that is an integer multiple of the minimum channel width W is provided by the parallel connection of an integral number of unit transistors, even if a systematic process error occurs in each unit transistor, what occurs in the second transistor is an error that is an integer multiple of the process error, whereby the channel width of the second transistor remains to be an integer multiple of that of the first transistor, thus preventing the systematic offset voltage SVoff from occurring.

However, with a transistor of the minimum channel width W being used as a unit in an actual circuit design, it is only possible under the very rare condition "If ratios as large as (or larger than) two are required" as stated in the article to provide each of the other transistors with a channel width W that is an integer multiple of the minimum channel width W.

Next, the influence of a random shift, rather than the systematic uniform shift as described above, will be described with reference to FIG. 26A and FIG. 26B using the pair of N-channel transistors MN3 (23) and MN4 (24) as an example.

FIG. 26A illustrates an example of a layout of the N-channel transistors MN3 (23) and MN4 (24) manufactured according to the design values shown in Table 1 above.

Referring to FIG. 26A, an N-type impurity diffusion region 12 for forming a channel of an N-channel transistor is provided, and the channel width W of the transistors MN3 (23) and MN4 (24) is designed to be equal to the width of the N-type impurity diffusion region 12.

FIG. 26B illustrates an example of a layout of the pair of N-channel transistors MN3 (23) and MN4 (24) after the semiconductor manufacturing process, where a process error has occurred randomly in the semiconductor manufacturing process, thereby increasing only the channel width W of the transistor MN3 (23), among the pair of transistors, by ΔW. Assuming that the width of the N-type impurity diffusion region 12 of the N-channel transistor MN3 (23) has increased by ΔW at one end whereas the width of the N-type impurity diffusion region 12 of the N-channel transistor MN4 (24) has not increased or decreased, the actual channel widths W of the two manufactured N-channel transistors MN3 (23) and MN4 (24) are expressed as follows:

$$(W+\Delta W)MN3 \quad (10)$$

$$(W)MN4 \quad (11)$$

Therefore, substituting Expressions (10) and (11) into Conditional Expression (3) for realizing random offset voltage RVoff=0 gives the following expression:

$$\{(W+\Delta W)/L\}MN3 \neq (W/L)MN4 \quad (12)$$

Thus, the equation no longer holds, indicating that the random offset voltage RVoff occurs due to various random process errors in the semiconductor manufacturing process.

SUMMARY OF THE INVENTION

An object of the present invention is to provide an analog MOS semiconductor device in which even if a process error occurs in a semiconductor manufacturing process, the systematic offset voltage SVoff and the random offset voltage RVoff can be sufficiently suppressed.

In order to achieve the object, according to the present invention, the unit transistor is not a transistor having the smallest channel width, among a plurality of MOS transistors included in an analog MOS semiconductor device. Instead, a transistor having a channel width that is obtained by dividing the smallest channel width by an integer is used as a micro-unit transistor so that each of the plurality of MOS transistors includes a number of micro-unit transistors.

Specifically, an analog MOS semiconductor device of the present invention is an analog MOS semiconductor device, including a plurality of MOS transistors, wherein: a transistor having a channel width that is obtained by dividing, by an integer, a smallest channel width among those of the plurality of MOS transistors is used as a micro-unit transistor; and each of the plurality of MOS transistors includes a plurality of micro-unit transistors.

In one embodiment, the plurality of MOS transistors include two types of MOS transistors of P-type MOS transistors and N-type MOS transistors; and the micro-unit transistors include two types of micro-unit transistors of P-type micro-unit transistors and N-type micro-unit transistors.

In one embodiment, each of MOS transistors that are included in a conditional expression for realizing zero systematic offset voltage includes a number of micro-unit transistors that satisfies the conditional expression for realizing zero systematic offset voltage.

In one embodiment, the micro-unit transistors of each MOS transistor overlap with one another.

In one embodiment, each micro-unit transistor includes an even number of small transistors; the even number of small transistors are connected in parallel to one another; and two of the even number of small transistors connected in parallel to one another that are located at opposite ends each have a source located at one end of the micro-unit transistor.

In one embodiment, the micro-unit transistor is a pair transistor including two small transistors connected in parallel to each other; and a source of one of the small transistors is located at one end of the pair transistor, and a source of the other one of the small transistors is located at the other end of the pair transistor.

In one embodiment, the micro-unit transistor includes a substrate contact via which one or more of electrodes of the micro-unit transistor is connected to a semiconductor substrate.

In one embodiment, the micro-unit transistor includes a gate contact connected to a gate of the micro-unit transistor, and a gate wire connected to the gate contact for applying a gate voltage to the gate.

In one embodiment, dummy micro-unit transistors are provided for adjusting a power of one or more of the plurality of MOS transistors.

In one embodiment, the dummy micro-unit transistors include two types of dummy micro-unit transistors of P-type dummy micro-unit transistors and N-type dummy micro-unit transistors.

In one embodiment, two MOS transistors forming a pair, among the plurality of MOS transistors, each include a number of micro-unit transistors that is a multiple of four.

In one embodiment, the plurality of MOS transistors have an SOI structure or an SOS structure.

A method for manufacturing an analog MOS semiconductor device of the present invention is a method for manufacturing an analog MOS semiconductor device including a plurality of MOS transistors, including the steps of: preparing a plurality of micro-unit transistors each having a channel width that is obtained by dividing, by an integer, a smallest channel width among those of the plurality of MOS transistors; and manufacturing the plurality of MOS transistors using the plurality of micro-unit transistors so that each of the plurality of MOS transistors includes more than one of the micro-unit transistors.

In one embodiment, if the plurality of MOS transistors include two types of MOS transistors of P-type MOS transistors and N-type MOS transistors, two types of micro-unit transistors of P-type micro-unit transistors and N-type micro-unit transistors are prepared as the micro-unit transistors, so that each P-type MOS transistor includes more than one of the P-type micro-unit transistors and each N-type MOS transistor includes more than one of the N-type micro-unit transistors.

In one embodiment, when manufacturing MOS transistors that are included in a conditional expression for realizing zero systematic offset voltage, the number of micro-unit transistors to be included in each of the MOS transistors is set to be a number that satisfies the conditional expression for realizing zero systematic offset voltage.

A program for manufacturing an analog MOS semiconductor device of the present invention is a program for manufacturing an analog MOS semiconductor device including a plurality of MOS transistors, the program including the steps of: defining, as a micro-unit transistor, a transistor having a channel width that is obtained by dividing, by an integer, a smallest channel width among those of the plurality of MOS transistors; and designing the plurality of MOS transistors so that each of the plurality of MOS transistors includes a plurality of micro-unit transistors.

A program device of the present invention is a program device, including the manufacturing program as described above, wherein the program device has an EDA function or a CAD function for manufacturing an analog MOS semiconductor device including a plurality of MOS transistors based on the manufacturing program.

As described above, according to the present invention, a micro-unit transistor is used as a unit, and each MOS transistor includes a plurality of micro-unit transistors. Therefore, even if the channel width ratio among a plurality of MOS transistors is not an integer ratio, it is possible to sufficiently suppress the occurrence of the systematic offset voltage SVoff when a systematic process error occurs.

Particularly, according to the present invention, a plurality of micro-unit transistors are arranged in a layout in which they overlap with one another. Therefore, it is possible to reduce the layout area of each MOS transistor while satisfying the condition for realizing systematic offset voltage SVoff=0.

Moreover, according to the present invention, each micro-unit transistor includes an even number of small transistors connected in parallel to one other, wherein sources of two small transistors that are located at opposite ends are located at opposite ends of the micro-unit transistor. Therefore, when a substrate contact is provided around the micro-unit transistor so as to be connected to the sources, the sources of the small transistors and the substrate contact are located close to each other, thereby shortening the distance therebetween and thus reducing the layout area. Furthermore, since the even number of small transistors can share a drain, the drain area is reduced and thus the capacitance component that is parasitic on the drain is reduced, thereby increasing the operation speed of the micro-unit transistor.

Furthermore, according to the present invention, when each MOS transistor includes a plurality of micro-unit transistors, the plurality of micro-unit transistors each have a substrate contact, whereby the potential of the substrate of the MOS transistor is stably maintained at the same value irrespective of the position in the substrate, thus reducing the possibility for a latch-up phenomenon to occur.

In addition, according to the present invention, where a MOS transistor having a large channel width includes a number of micro-unit transistors, a gate voltage is individually applied to the gate of each of the number of micro-unit transistors via a corresponding gate wire. Therefore, a predetermined gate voltage is applied to the MOS transistor as a whole, whereby it is possible to obtain a driving power that is substantially equal to the design value.

Furthermore, according to the present invention, dummy micro-unit transistors are provided for adjusting the power of the MOS transistor. Therefore, a fine adjustment of the channel width of the MOS transistor can be made by connecting one or more of the dummy micro-unit transistors by modifying the wiring structure. Thus, it is possible to reduce the development time for an analog MOS semiconductor device by reducing the amount of time required for making prototypes.

Moreover, according to the present invention, each of two MOS transistors forming a pair includes a number of micro-unit transistors that is a multiple of four, whereby it is possible to arrange the pair of MOS transistors in a centroid structure. Therefore, it is possible to more effectively suppress the systematic offset voltage.

Furthermore, according to the present invention, a plurality of MOS transistors have an SOI structure or an SOS structure, whereby it is possible to realize an operation under an extremely low voltage and to reduce the influence of shot noise due to radioactive rays such as α rays. Furthermore, in an analog/digital mixed semiconductor device, it is possible to effectively reduce the influence of noise creeping into the analog section from the digital section.

In addition, according to the present invention, a circuit design process for a plurality of MOS transistors each including a plurality of micro-unit transistors can be automated, thereby effectively reducing the design/development time for an analog MOS semiconductor device and effectively reducing the development cost therefor.

DETAILED DESCRIPTION OF THE INVENTION

Preferred embodiments of the present invention will now be described with reference to the accompanying drawings.

First Embodiment

Figure 23:
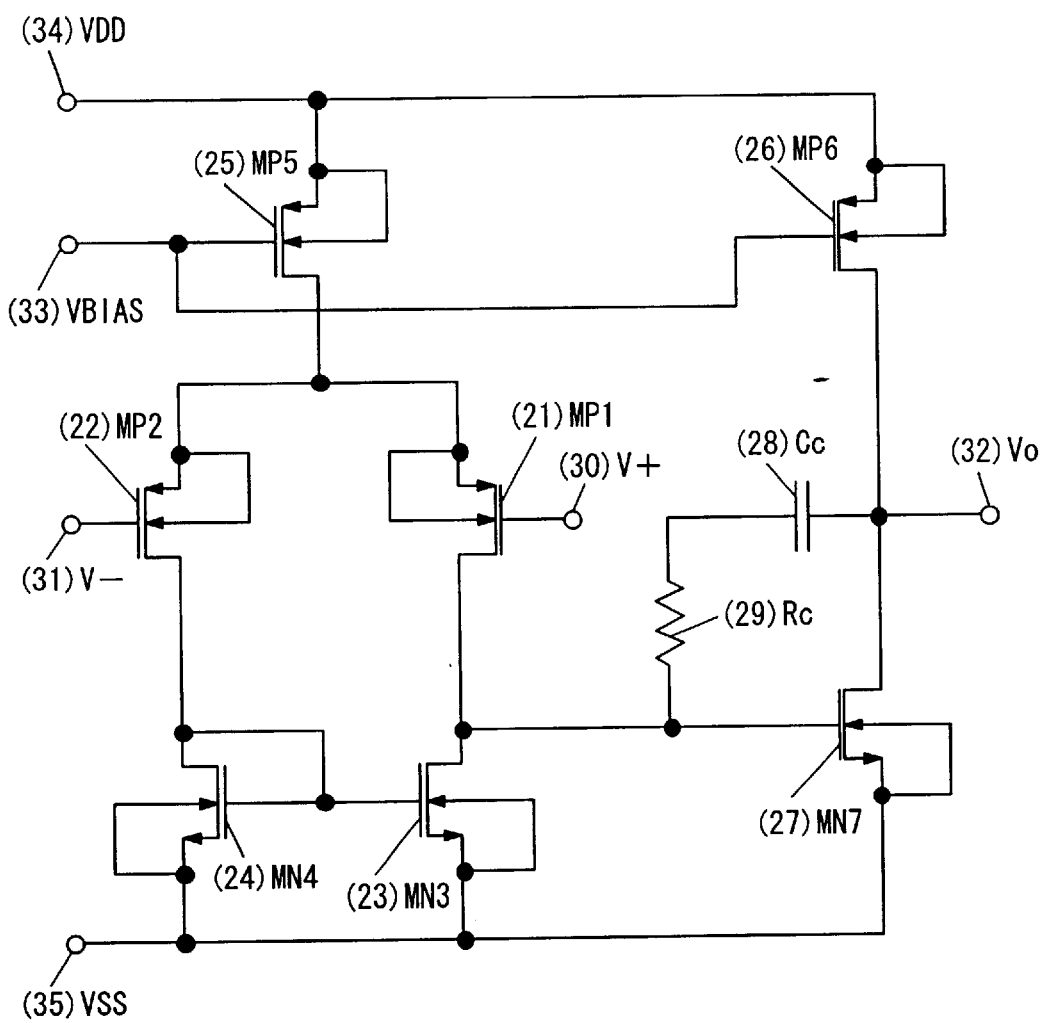
FIG. 23 is a circuit diagram illustrating an operational amplifier as an analog semiconductor device.

FIG. 1 to FIG. 7 and FIG. 23 illustrate an analog MOS semiconductor device according to the first embodiment of the present invention. FIG. 23 illustrates an operational amplifier as an analog MOS semiconductor device. The operational amplifier illustrated in the figure includes four P-channel MOS transistors MP1 (21), MP2 (22), MP5 (25) and MP6 (26), three N-channel MOS transistors MN3 (23), MN4 (24) and MN7 (27), a capacitor Cc (28), and a resistor Rc (29).

A feature of the present embodiment is that each of the transistors MP1 (21) to MN7 (27) includes a number of micro-unit transistors of the corresponding conductivity type. The number of micro-unit transistors to be used in each of the transistors MP1 (21) to MN7 (27) will now be discussed. It is assumed that P-type micro-unit transistors are used for each P-channel MOS transistor, and N-type micro-unit transistors are used for each N-channel MOS transistor.

TABLE 2

|  | W (μm) | L (μm) |
|---|---|---|
| MUPA | 10.00 | 1.00 |
| MUPB | 10.00 | 0.50 |
| MUNB | 5.00 | 0.50 |
| UR | 1.00 kΩ |  |
| UC | 0.50 pF |  |

TABLE 3

|  | Unit × # | W (μm) | L (μm) |
|---|---|---|---|
| MP1 | MUPA × 13 | 130.00 | 1.00 |
| MP2 | MUPA × 13 | 130.00 | 1.00 |
| MN3 | MUNB × 6 | 30.00 | 0.50 |
| MN4 | MUNB × 6 | 30.00 | 0.50 |
| MP5 | MUPB × 9 | 90.00 | 0.50 |
| MP6 | MUPB × 42 | 420.00 | 0.50 |
| MN7 | MUNB × 56 | 280.00 | 0.50 |
| Rc | UR × 7 | 7.00 kΩ |  |
| Cc | UC × 7 | 3.50 pF |  |

It is assumed that the channel widths W and the channel lengths L of the transistors MP1 (21) to MN7 (27) of the operational amplifier illustrated in FIG. 23 are as shown in Table 3 above. Where NX (X=1 to 7) denotes the number of micro-unit transistors used in the transistors MP1 (21) to MN7 (27), respectively, shown in Table 3, the channel widths W of the transistors MP1 (21) to MN7 (27) satisfy the following expression:

$$(W/L)MN3=N3\times(W/L)MUNB \quad (13)$$

$$(W/L)MN4=N4\times(W/L)MUNB \quad (14)$$

$$(W/L)MP5=N5\times(W/L)MUPB \quad (15)$$

$$(W/L)MP6=N6\times(W/L)MUPB \quad (16)$$

$$(W/L)MN7=N7\times(W/L)MUNB \quad (17)$$

In the expressions, NX (X=1 to 7) is an integer. Moreover, "MUNB" and "MUPB" denote an N-type micro-unit transistor and a P-type micro-unit transistor, respectively.

Substituting Expressions (13) to (17) into the conditional expression for realizing systematic offset voltage SVoff=0 in the operational amplifier of FIG. 23 (i.e., Expression (1) above) gives the following expression:

$$[N3\times(W/L)MUNB]/[N7\times(W/L)MUNB]$$

$$=[N4\times(W/L)MUNB]/[N7\times(W/L)MUNB]$$

$$=[N5\times(W/L)MUPB]/[N6\times(W/L)MUPB]/2 \quad (18)$$

Rearranging the expression eventually gives the following expression:

$$N3/N7=N4/N7=N5/N6/2 \quad (19)$$

Expression (19) is a conditional expression for realizing systematic offset voltage SVoff=0 in the operational amplifier of FIG. 23 where P-type and N-type micro-unit transistors are used.

As can be seen from Table 3, the P-channel MOS transistors MP1 and MP2 having a channel length of L=1.00 (μm) each include thirteen P-type micro-unit transistors MUPA whose channel width W is 1/13 of the channel width W=130.00 (μm) of the transistors MP1 and MP2, i.e., 10.00 (μm). The P-channel MOS transistors MP5 and MP6 having a channel length of L=0.50 (μm) respectively include nine and forty two P-type micro-unit transistors MUPB whose channel width W is 1/9 of the channel width W=90.00 (μm) of the narrower one of the transistors MP5 and MP6, i.e., 10.00 (μm). The N-channel MOS transistors MN3, MN4 and MN7 having a channel length of L=0.50 (μm) respectively include six, six and fifty six N-type micro-unit transistors MUNB whose channel width W is 1/6 of the channel width W=30.00 (μm) of the narrowest one of the transistors MN3, MN4 and MN7, i.e., 5.00 (μm). Thus, in Conditional Expression (19) for realizing systematic offset voltage SVoff=0, the numbers of micro-unit transistors of the transistors MN3, MN4, MP5, MP6 and MN7, which are included in the expression, are set as follows: N3=N4=6, N5=9, N6=42 and N7=56, so as to satisfy Conditional Expression (19).

In Table 3 above, the resistance of the resistor Rc (29) is 7.00 (kΩ), and the capacitance of the capacitor Cc (28) is 3.50 (pF). The resistance of each of unit resistors UR included in the resistor Rc (29) is set to be 1.00 (kΩ), and the capacitance of each of unit capacitors UC included in the capacitor Cc (28) is set to be 0.50 (pF). The micro-unit transistors MUPA, MUPB and MUNB, the unit capacitor UC and the unit resistor UR are shown together in Table 2.

Figure 1:
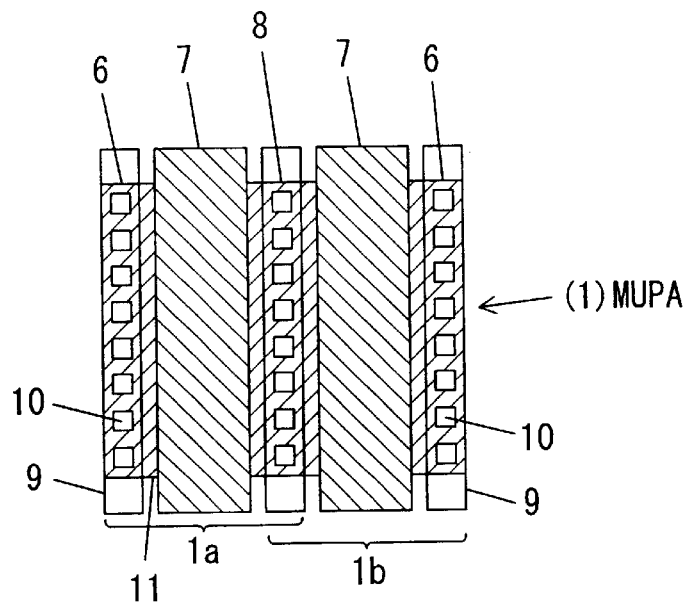
FIG. 1 is a diagram illustrating a layout of a P-type micro-unit transistor used in an operational amplifier according to the first embodiment of the present invention.
Figure 2:
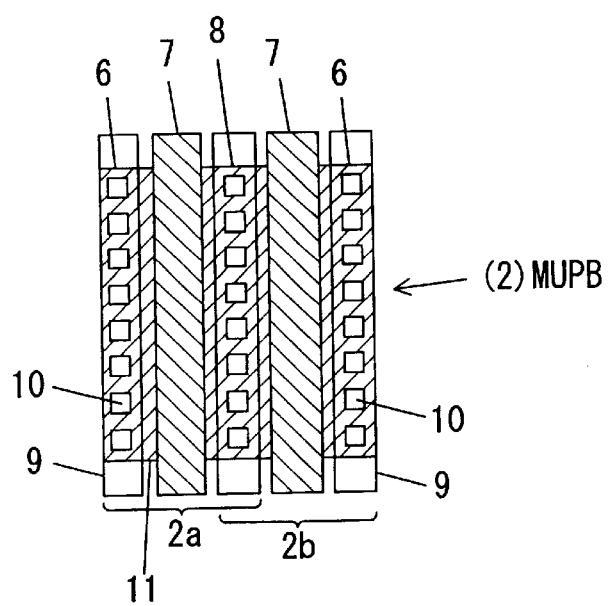
FIG. 2 is a diagram illustrating a layout of another P-type micro-unit transistor used in the operational amplifier.
Figure 3:
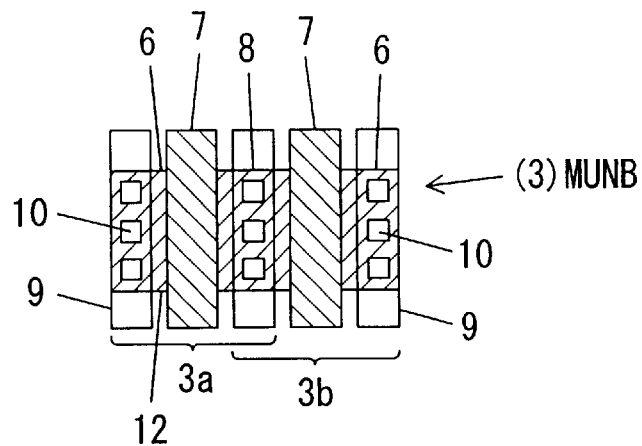
FIG. 3 is a diagram illustrating a layout of an N-type micro-unit transistor used in the operational amplifier.
Figure 4:
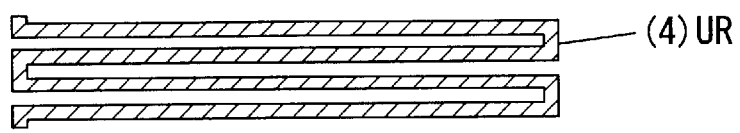
FIG. 4 is a diagram illustrating a layout of a unit resistor used in the operational amplifier.
Figure 5:
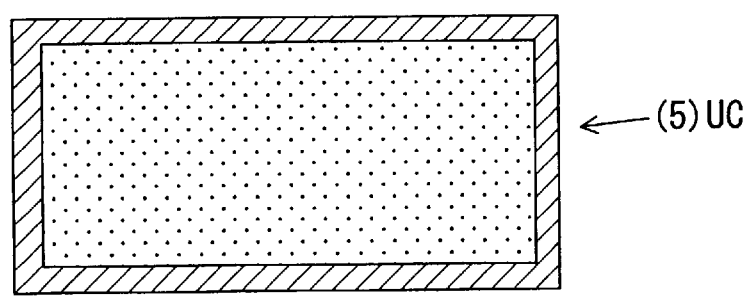
FIG. 5 is a diagram illustrating a layout of a unit capacitor used in the operational amplifier.

FIG. 1 illustrates the P-type micro-unit transistor MUPA (1), FIG. 2 illustrates the P-type micro-unit transistor MUPB (2), FIG. 3 illustrates the N-type micro-unit transistor MUNB (3), FIG. 4 illustrates a unit resistor UR (4), and FIG. 5 illustrates a unit capacitor UC (5). The micro-unit transistors of FIG. 1 to FIG. 3 are similar in configuration, but have different combinations of channel width W and channel length L. Specifically, each of the micro-unit transistors MUPA, MUPB and MUNB is a pair transistor including a pair of small transistors (1a and 1b), (2a and 2b), (3a and 3b), respectively. The small transistors are obtained by dividing, with respect to the channel width W, each micro-unit transistor into two portions of an equal channel width of W/2. Each pair of small transistors (1a and 1b), (2a and 2b), (3a and 3b) are connected in parallel to each other, with the drain 8 to be shared by the pair of small transistors being located in the central position, the source 6 of the small transistor 1a, 2a, 3a being located at the left end, and the source 6 of the small transistor 1b, 2b, 3b being located at the right end. The gate 7 of each small transistor is located between one of the sources 6 and 6 and the drain 8. Each source 6 includes the contacts 10, via which it is connected to the aluminum wire 9 of a predetermined wiring layer, and a source voltage is supplied to the source 6 from the aluminum wire 9. Note that in FIG. 1 to FIG. 3, reference numeral 11 is a P-type impurity diffusion region for forming a channel of a P-channel transistor, and reference numeral 12 is an N-type impurity diffusion region for forming a channel of an N-channel transistor.

FIG. 4 illustrates an example of a layout in which the unit resistor UR (4), as shown in Table 2, is a polysilicon resistor. Moreover, FIG. 5 illustrates an example of a layout in which the unit capacitor UC (5), shown in Table 2, is a two-layer polysilicon capacitor.

Figure 6:
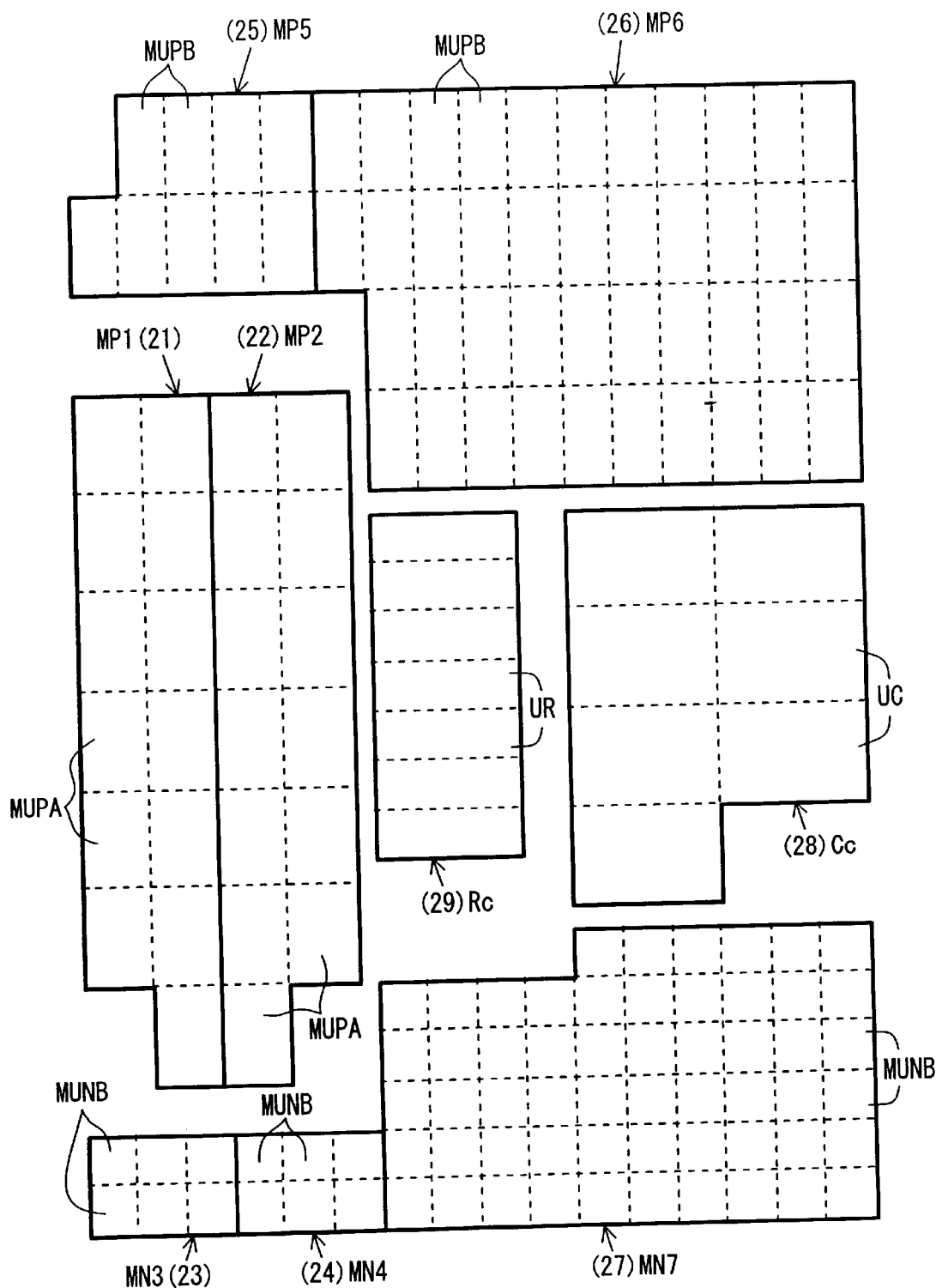
FIG. 6 is a diagram illustrating a layout of the operational amplifier.

FIG. 6 illustrates an example of a layout of the transistors MP1 to MN7, the capacitor Cc and the resistor Rc of the operational amplifier. The transistors, the resistor and the capacitor each include a number (the number shown in Table 3) of the micro-unit transistors MUPA, MUPB and MUNB, the unit resistor UR and the unit capacitor UC, as illustrated in FIG. 1 to FIG. 5. In FIG. 6, each chain line indicates a boundary between micro-unit transistors, a boundary between unit resistors, or a boundary between unit capacitors.

Figure 7:
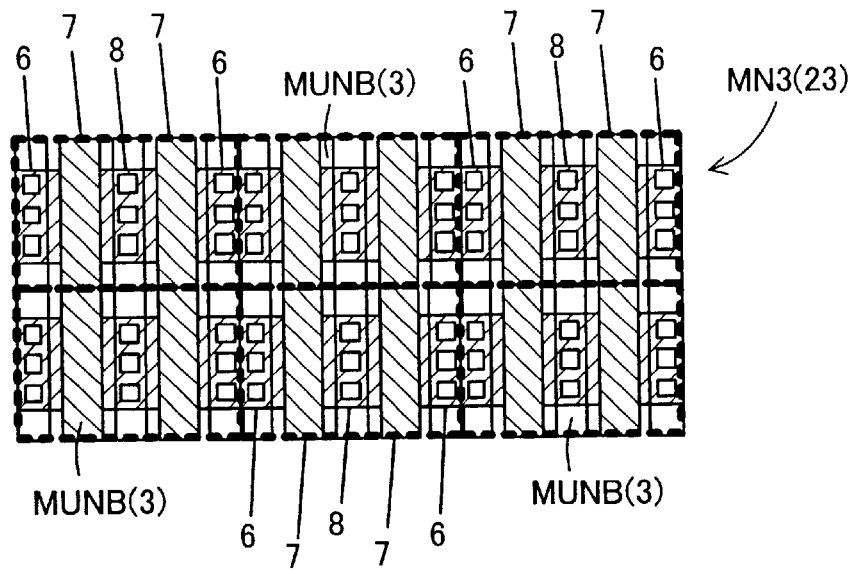
FIG. 7 is a diagram illustrating a layout of one MOS transistor provided in the operational amplifier, where the MOS transistor includes six micro-unit transistors.

FIG. 7 illustrates a detailed layout of the N-channel transistor MN3 (23) illustrated in FIG. 6, including six (see Table 3) N-type micro-unit transistors MUNB (3) of FIG. 3. In FIG. 7, the N-type micro-unit transistors MUNB (3) are arranged in two rows by three columns. In FIG. 7, each solid chain line indicates a boundary between the N-type micro-unit transistors MUNB (3).

In the present embodiment, even if a process error occurs, the systematic offset voltage SVoff is zero for the following reasons. As in the description of the conventional example, it is assumed that a uniform process error of ΔW occurs in the decreasing direction in the semiconductor manufacturing process.

The width of the P-type micro-unit transistor MUPB (2) illustrated in FIG. 2 is reduced by ΔW at each end due to various process errors in the semiconductor manufacturing process as in the conventional example, and thus the width is reduced by 2ΔW in total. Therefore, the actual channel width W of the manufactured P-type micro-unit transistor MUPB (2) is expressed as follows:

$$(W-2\Delta W)MUPB \quad (20)$$

Similarly, the actual channel width W of the manufactured N-type micro-unit transistor MUNB (3) is expressed as follows:

$$(W-2\Delta W)MUNB \quad (21)$$

Therefore, substituting Expressions (20) and (21) into Expressions (13) to (17), the actual channel widths W of the manufactured transistors are expressed as follows:

$$(W/L)MN3 = N3 \times \{(W-2\Delta W)/L\}MUNB \quad (22)$$

$$(W/L)MN4 = N4 \times \{(W-2\Delta W)/L\}MUNB \quad (23)$$

$$(W/L)MP5 = N5 \times \{(W-2\Delta W)/L\}MUPB \quad (24)$$

$$(W/L)MP6 = N6 \times \{(W-2\Delta W)/L\}MUPB \quad (25)$$

$$(W/L)MN7 = N7 \times \{(W-2\Delta W)/L\}MUNB \quad (26)$$

Therefore, substituting Expressions (22) to (26) into Conditional Expression (1) for realizing systematic offset voltage SVoff=0 gives the following expression:

$$[N3 \times \{(W-2\Delta W)/L\}MUNB]/[N7 \times \{(W-2\Delta W)/L\}MUNB]$$
$$= [N4 \times \{(W-2\Delta W)/L\}MUNB]/[N7 \times \{(W-2\Delta W)/L\}MUNB]$$
$$= [N5 \times \{(W-2\Delta W)/L\}MUPB]/[N6 \times \{(W-2\Delta W)/L\}MUPB]/2 \quad (27)$$

Rearranging the expression eventually gives the following expression:

$$N3/N7 = N4/N7 = N5/N6/2 \quad (28)$$

The resultant expression, Expression (28), is the same as Conditional Expression (19) for realizing systematic offset voltage SVoff=0 where micro-unit transistors are used.

Therefore, the present embodiment employs a layout in which micro-unit transistors are used, whereby even if various process errors occur in the manufacturing process, the conditional expression for realizing systematic offset voltage SVoff=0 holds, whereby the systematic offset voltage SVoff does not occur at all.

Note that while the unit resistor UR (4) is a polysilicon resistor in the present embodiment, it may alternatively be a diffused resistor. Furthermore, while the unit capacitor UC (5) is a two-layer polysilicon capacitor in the present embodiment, it may alternatively be an interlayer film capacitor or an MIM capacitor.

Second Embodiment

Next, the second embodiment of the present invention will be described with reference to FIG. 8.

Figure 8:
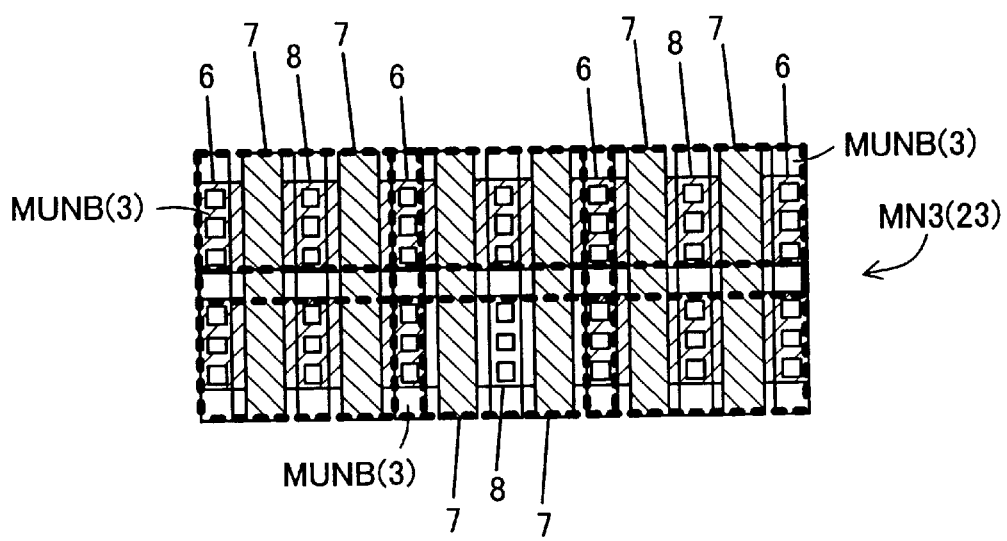
FIG. 8 is a diagram illustrating a detailed layout of one MOS transistor provided in an analog semiconductor device according to the second embodiment of the present invention.

FIG. 8 is a detailed layout diagram illustrating a variation of the N-channel transistor MN3 (23) illustrated in FIG. 7. In FIG. 8, the N-channel transistor MN3 (23) includes six N-type micro-unit transistors MUNB (3) shown in Table 3, and each solid chain line indicates a boundary therebetween. Note that those elements in FIG. 8 that are already shown in FIG. 7 are denoted by the same reference numerals.

In FIG. 7, the N-type micro-unit transistors MUNB (3) are arranged so as to abut on one another along the boundary lines with no gap and no overlap therebetween. In the present embodiment, the N-type micro-unit transistors MUNB (3) are arranged, as illustrated in FIG. 8, so as to overlap with one another in the row direction and in the column direction, while satisfying the semiconductor device design rule.

Therefore, as in the first embodiment, it is possible to reduce the layout area of the N-channel transistor MN3 (23) while satisfying Conditional Expression (19) for realizing systematic offset voltage SVoff=0.

Note that while the present invention is applied to the N-channel transistor MN3 (23) in the present embodiment, it is of course similarly applicable to the other transistors MP1 (21), MP2 (22), MN4 (24), MP5 (25), MP6 (26) and MN7 (27) of the operational amplifier. Moreover, while the N-type micro-unit transistor MUNB (3) is used as a micro-unit transistor in the present embodiment, other P-type micro-unit transistors MUPA (1) and MUPB (2) may of course be used.

Third Embodiment

Next, the third embodiment of the present invention will be described with reference to FIG. 9 and FIG. 10.

Figure 9:
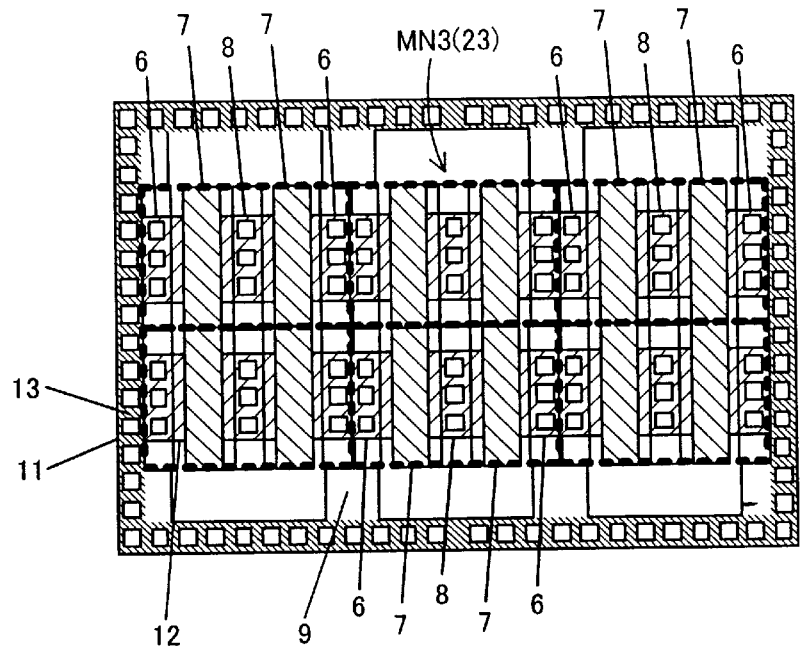
FIG. 9 is a diagram illustrating a detailed layout of one MOS transistor provided in an analog semiconductor device according to the third embodiment of the present invention.

FIG. 9 illustrates an example of a layout in which a base (substrate contact) 13 is provided around the N-channel transistor MN3 (23) illustrated in FIG. 7, wherein the base 13 is provided so that the base 13 can be connected to the sources 6 that are located at opposite ends, and the sources 6 that are located in inner positions can also be connected to the peripheral base 13 via the aluminum wire 9, whereby the potential of the semiconductor substrate (not shown) can be maintained to be equal to the potential of the sources 6.

Figure 10:
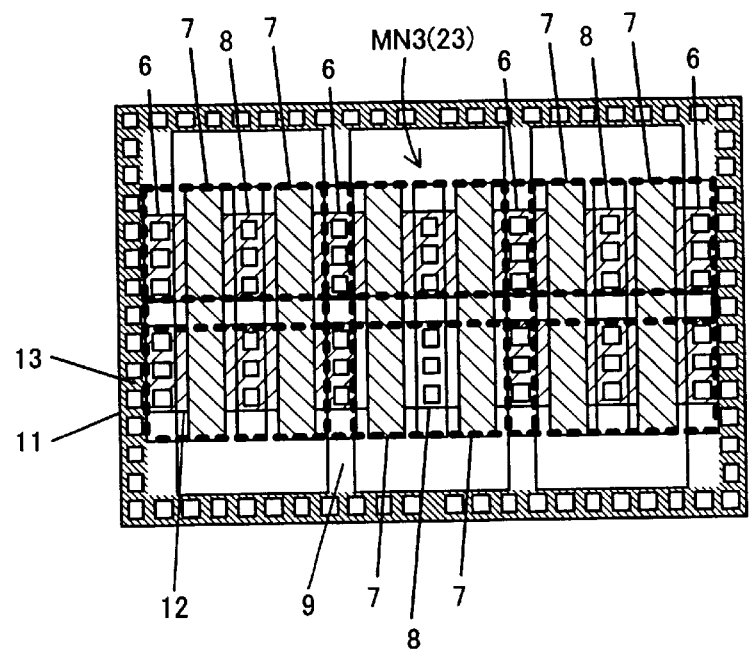
FIG. 10 is a diagram illustrating another detailed layout of the MOS transistor.

FIG. 10 illustrates an example of a layout employing the N-channel transistor MN3 (23) in which the micro-unit transistors overlap with one another in the row direction and in the column direction as illustrated in FIG. 8, instead of the N-channel transistor MN3 (23) as illustrated in FIG. 9.

Thus, in the present embodiment, it is of course possible to satisfy Conditional Expression (19) for realizing systematic offset voltage SVoff=0. In addition, with the layout in which the sources 6 and 6 are arranged at opposite ends of the N-channel transistor MN3 (23), on the left side and the right side in the figure, if the base 13 is arranged along the periphery of the N-channel transistor MN3 (23), the base 13 and the sources 6 and 6 are located close to each other. Therefore, in a case where the potential of the semiconductor substrate is set to be the same as the potential of the sources 6, it is possible to effectively reduce the layout area.

Moreover, as can be seen from FIG. 3, when the micro-unit transistor MUNB (3) in which two small transistors 3a and 3b are connected in parallel to each other is employed, the two small transistors 3a and 3b can share a drain, whereby the drain area and the source area of the N-channel transistor MN3 (23) are in the following relationship:

$$\text{Drain area} < \text{Source area} \quad (29)$$

Therefore, the capacitance component that is parasitic on the drain 8 can be reduced, whereby it is possible to increase the operation speed of the N-channel transistor MN3 (23).

Note that in FIG. 3, the N-type micro-unit transistor MUNB (3) includes two small transistors 3a and 3b, which are obtained by dividing, with respect to the channel width, the N-type micro-unit transistor MUNB (3) into two portions of an equal channel width, and which are connected in parallel to each other. Alternatively, a micro-unit transistor can be divided, with respect to the channel width, into another even number of portions of an equal channel width, thereby obtaining an even number of small transistors that are connected in parallel to one another, with the sources of the two of the small transistors that are located at opposite ends being located at opposite ends of the micro-unit transistor layout. This similarly applies to the P-type micro-unit transistors MUPA (1) and MUPB (2) as illustrated in FIG. 1 and FIG. 2, respectively. Thus, each of the P-type micro-unit transistors MUPA (1) and MUPB (2) may alternatively be divided, with respect to the channel width, into an even number (other than two) of small transistors of an equal channel width, which are connected in parallel to one another.

Fourth Embodiment

Next, the fourth embodiment of the present invention will be described with reference to FIG. 11 to FIG. 15.

Figure 11:
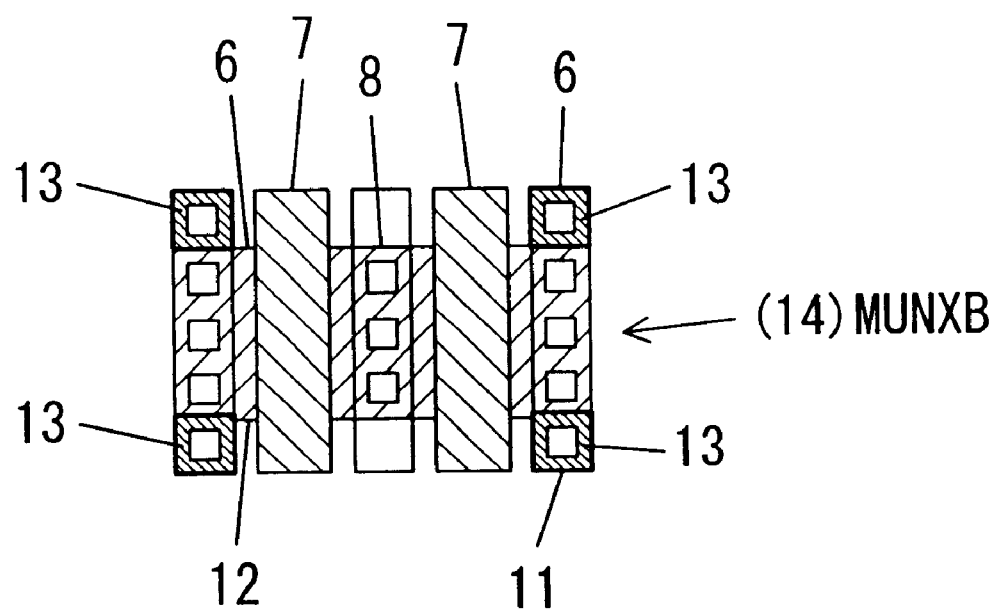
FIG. 11 is a diagram illustrating a layout of a micro-unit transistor used in an analog semiconductor device according to the fourth embodiment of the present invention.

An N-type micro-unit transistor MUNXB (14) illustrated in FIG. 11 includes the substrate contacts 13 in combination with the N-type micro-unit transistor MUNB (3) of FIG. 3 described above in the first embodiment. The substrate contacts 13 are formed at opposite ends, in the width direction, of each of the two sources (electrodes) 6 and 6 that are located at opposite ends, on the left side and the right side.

Figure 12:
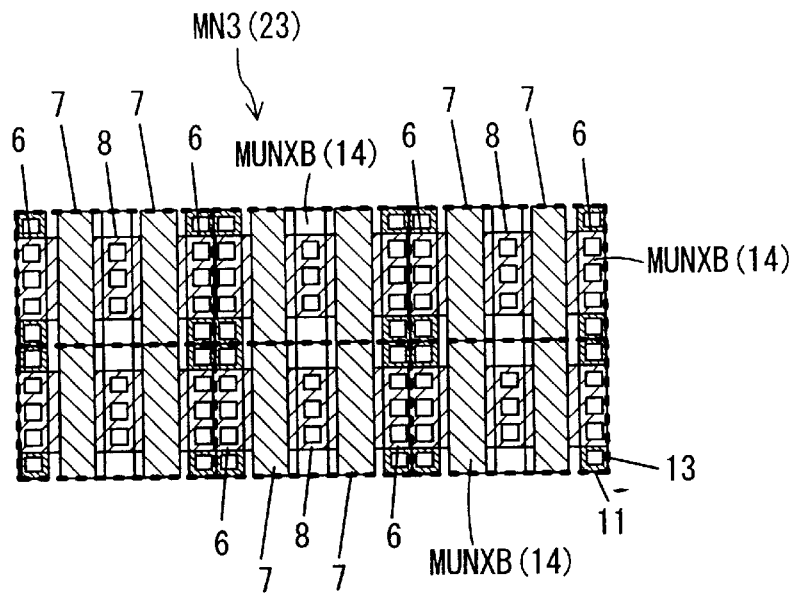
FIG. 12 is a diagram illustrating a layout of one MOS transistor provided in the analog semiconductor device, where the MOS transistor includes six micro-unit transistors.
Figure 13:
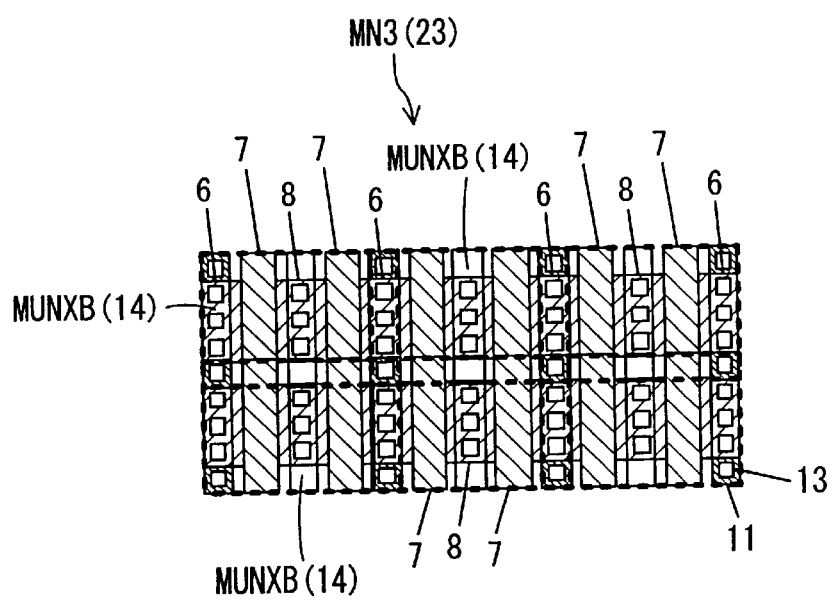
FIG. 13 is a diagram illustrating another detailed layout of the MOS transistor.
Figure 14:
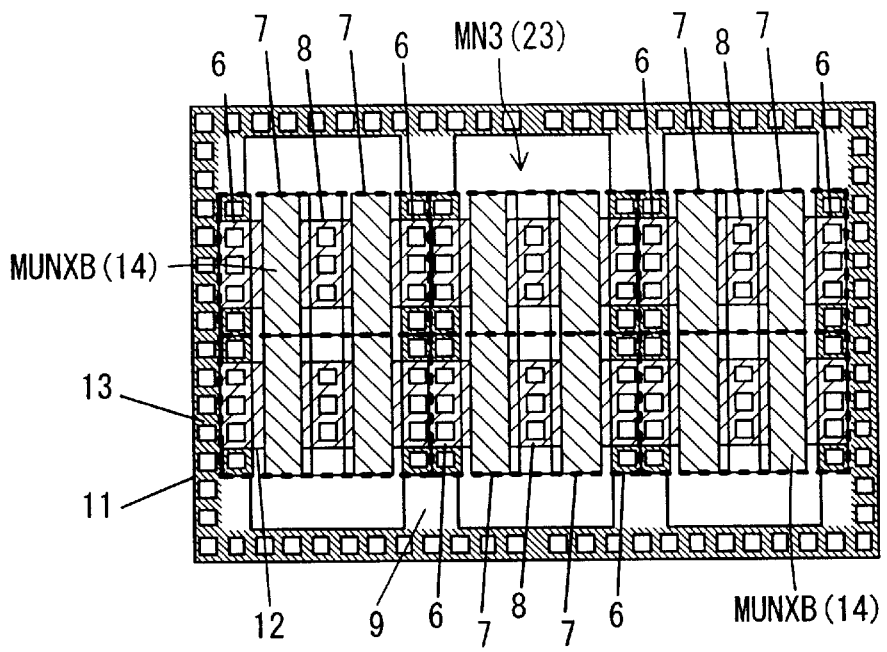
FIG. 14 is a diagram illustrating still another detailed layout of the MOS transistor.
Figure 15:
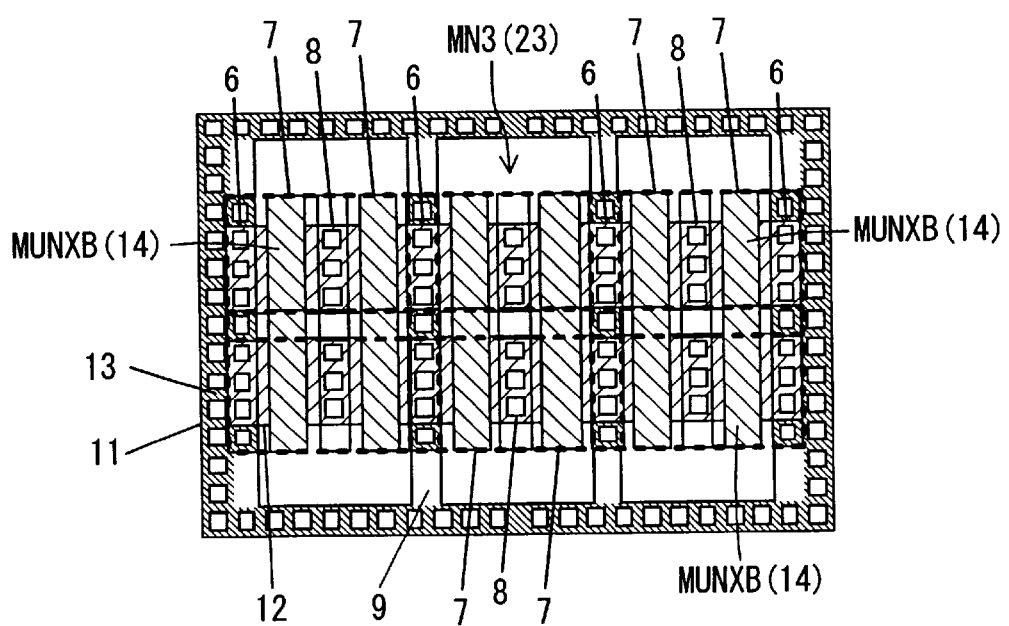
FIG. 15 is a diagram illustrating yet another detailed layout of the MOS transistor.

FIG. 12 illustrates the N-channel transistor MN3 (23) using six N-type micro-unit transistors MUNXB (14) illustrated in FIG. 11, which are arranged in a layout as that shown in FIG. 7. FIG. 13 illustrates the N-channel transistor MN3 (23) using six N-type micro-unit transistors MUNXB (14) illustrated in FIG. 11, which are arranged in a layout as that shown in FIG. 8 so that the N-type micro-unit transistors MUNXB (14) overlap with one another. FIG. 14 illustrates the N-channel transistor MN3 (23) illustrated in FIG. 12, around which a plurality of bases 13 are arranged in a layout as that shown in FIG. 9. FIG. 15 illustrates the N-channel transistor MN3 (23) illustrated in FIG. 13, around which a plurality of bases 13 are arranged in a layout as that shown in FIG. 10.

In a transistor layout including a number of micro-unit transistors as illustrated in FIG. 9 or FIG. 10, where only the sources 6 of the small transistors of the N-type micro-unit transistors MUNB (3) that are located at opposite ends of the N-channel transistor MN3 (23) are connected to the substrate contact 13, the substrate potential in the central portion of the N-channel transistor MN3 (23) is slightly shifted from the predetermined potential due to the substrate resistance, thereby increasing the possibility for a latch-up phenomenon to occur.

In the present embodiment, however, the N-type micro-unit transistor MUNXB (14) itself includes the substrate contact 13 as illustrated in FIG. 11, whereby even with a transistor including a number of micro-unit transistors, the potential in the central portion of the substrate can be stably maintained at the predetermined potential as the substrate potential in the peripheral portion, thereby reducing the possibility for a latch-up phenomenon to occur.

Note that while the N-type micro-unit transistor MUNXB (14) is shown in FIG. 11, it is of course possible to apply the present invention to a P-type micro-unit transistor with each source thereof being provided with a substrate contact.

Fifth Embodiment

Next, the fifth embodiment of the present invention will be described with reference to FIG. 16 to FIG. 20.

Figure 16:
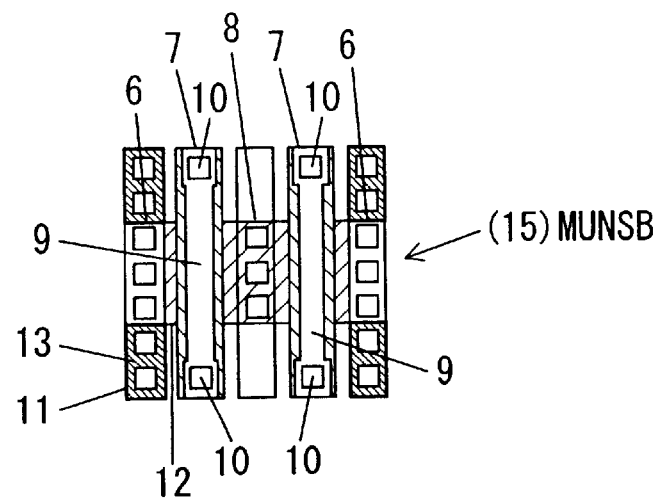
FIG. 16 is a diagram illustrating a layout of a micro-unit transistor used in an analog semiconductor device according to the fifth embodiment of the present invention.

An N-type micro-unit transistor MUNSB (15) illustrated in FIG. 16 is similar to the N-type micro-unit transistor MUNXB (14) of FIG. 11 described above in the fourth embodiment, but with the contacts 10 and 10 being provided at opposite ends in the width direction of each of the two gates 7 and 7, and the two contacts 10 being connected to the gate wire 9 made of aluminum so that the gate voltage is supplied to the gate 7 via the gate wire 9.

Figure 17:
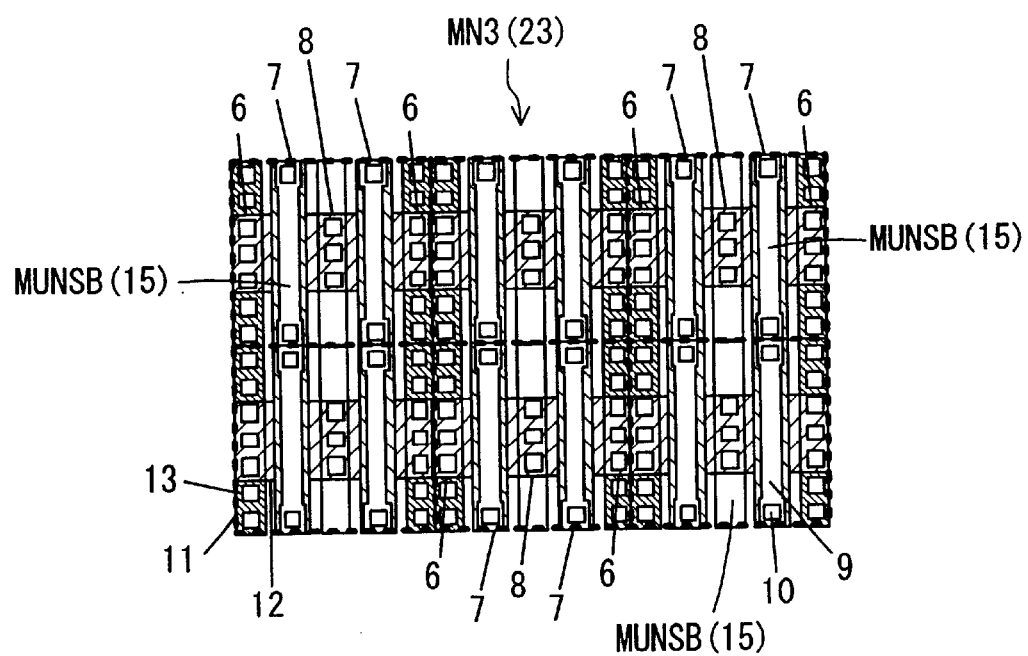
FIG. 17 is a diagram illustrating a layout of one MOS transistor provided in the analog semiconductor device, where the MOS transistor includes six micro-unit transistors.
Figure 18:
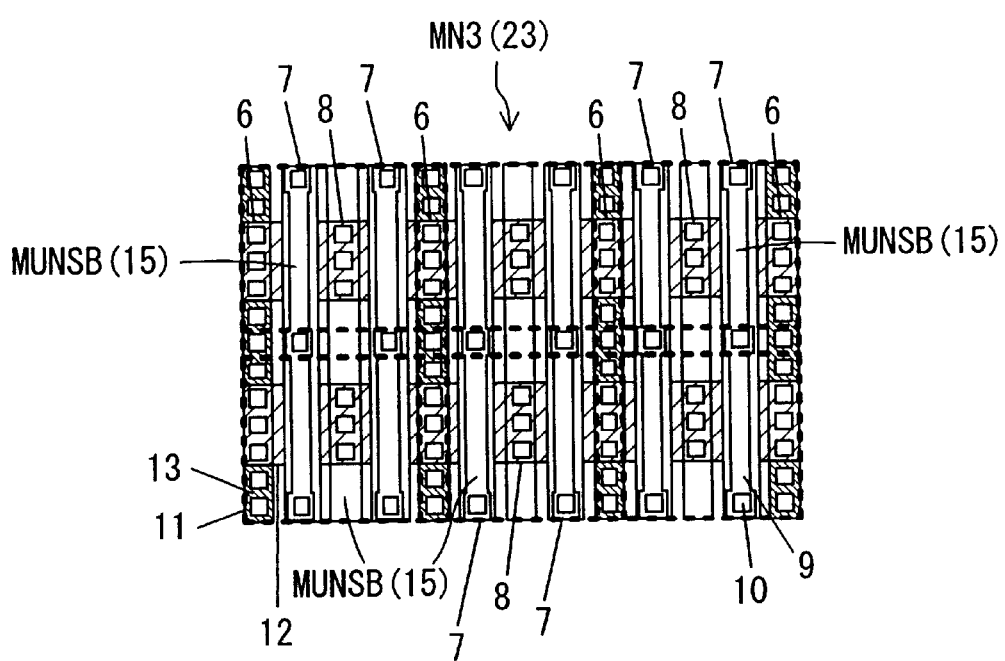
FIG. 18 is a diagram illustrating another detailed layout of the MOS transistor.
Figure 19:
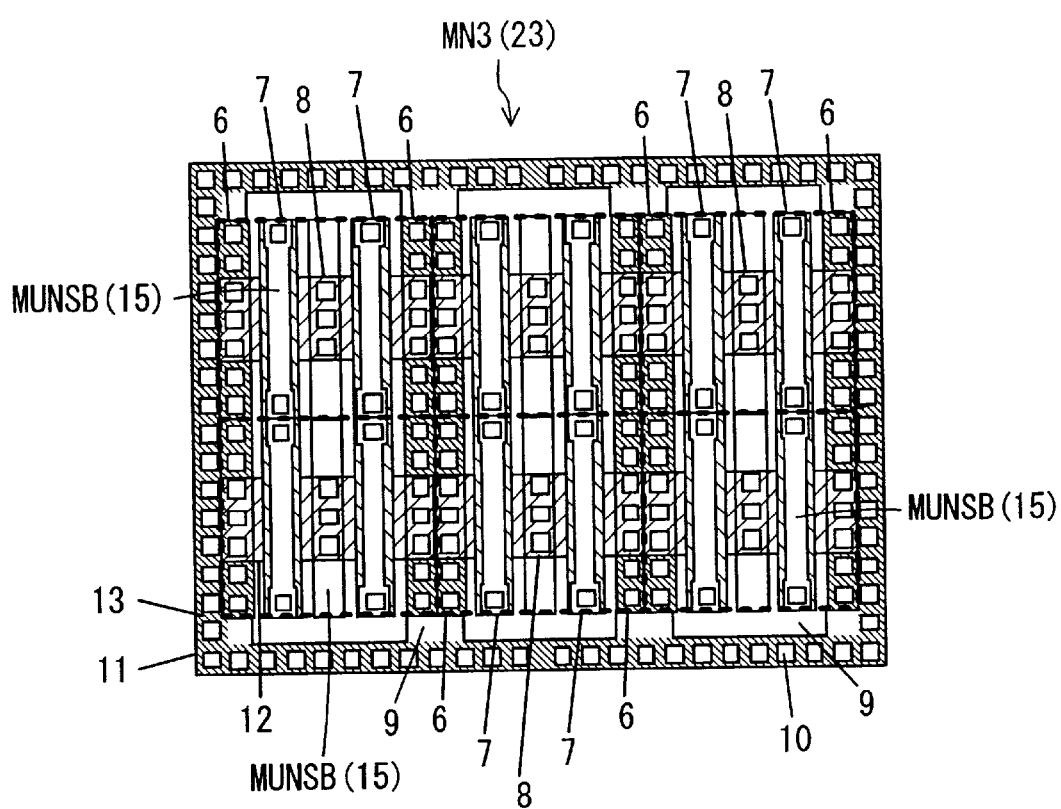
FIG. 19 is a diagram illustrating still another detailed layout of the MOS transistor.
Figure 20:
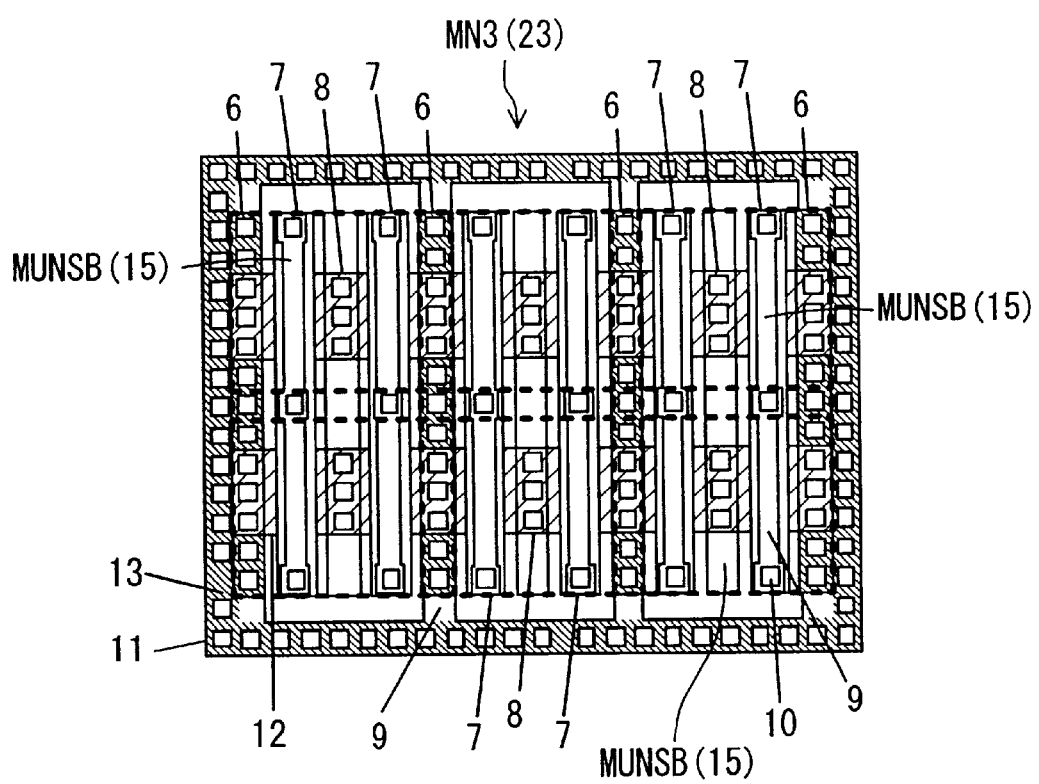
FIG. 20 is a diagram illustrating yet another detailed layout of the MOS transistor.

FIG. 17 illustrates the N-channel transistor MN3 (23) using six N-type micro-unit transistors MUNSB (15) illustrated in FIG. 16, which are arranged in a layout as that shown in FIG. 7. FIG. 18 illustrates the N-channel transistor MN3 (23) using six N-type micro-unit transistors MUNSB (15) illustrated in FIG. 16, which are arranged in a layout as that shown in FIG. 8 so that the N-type micro-unit transistors MUNSB (15) overlap with one another. FIG. 19 illustrates the N-channel transistor MN3 (23) illustrated in FIG. 17, around which a plurality of bases 13 are arranged in a layout as that shown in FIG. 9. FIG. 20 illustrates the N-channel transistor MN3 (23) illustrated in FIG. 18, around which a plurality of bases 13 are arranged in a layout as that shown in FIG. 10.

Figure 24:
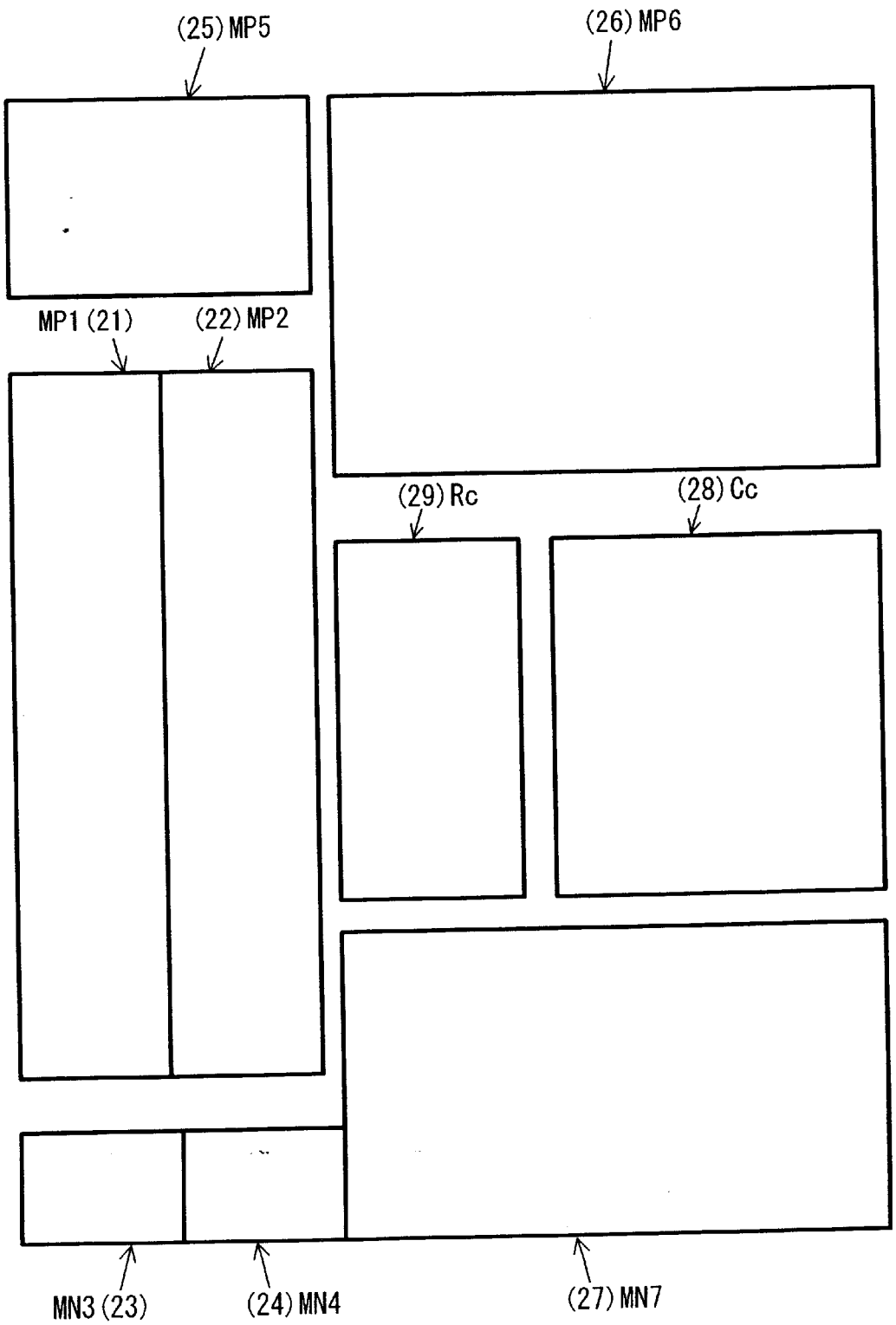
FIG. 24 is a diagram illustrating a layout of a conventional operational amplifier.
Figure 25:
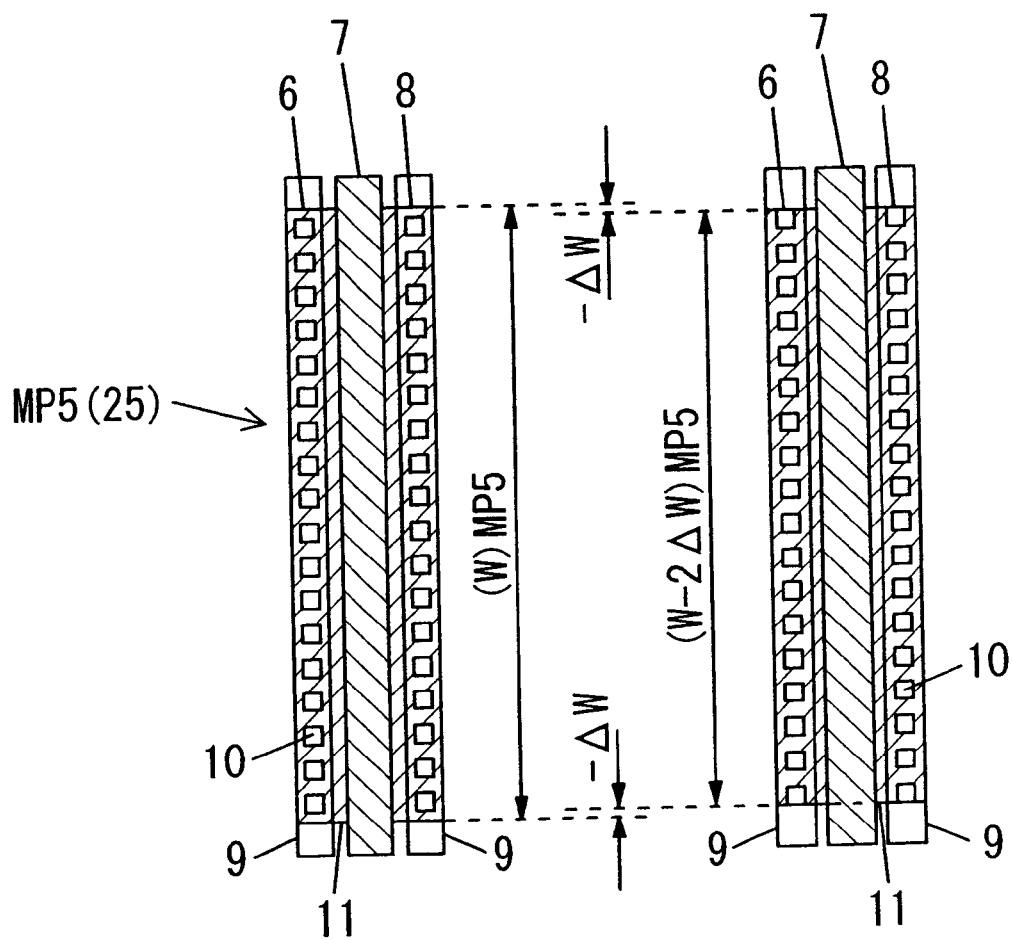
FIG. 25 is a diagram illustrating a process error occurring in a MOS transistor in the conventional operational amplifier.
Figure 26A:
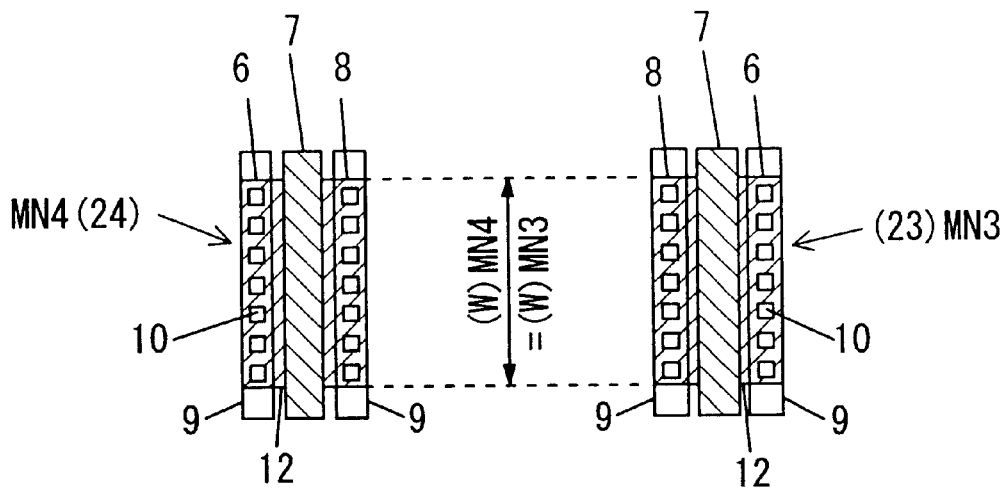
FIG. 26A is a diagram illustrating a layout of a MOS transistor in a case where no process error has occurred in the manufacturing process.
Figure 26B:
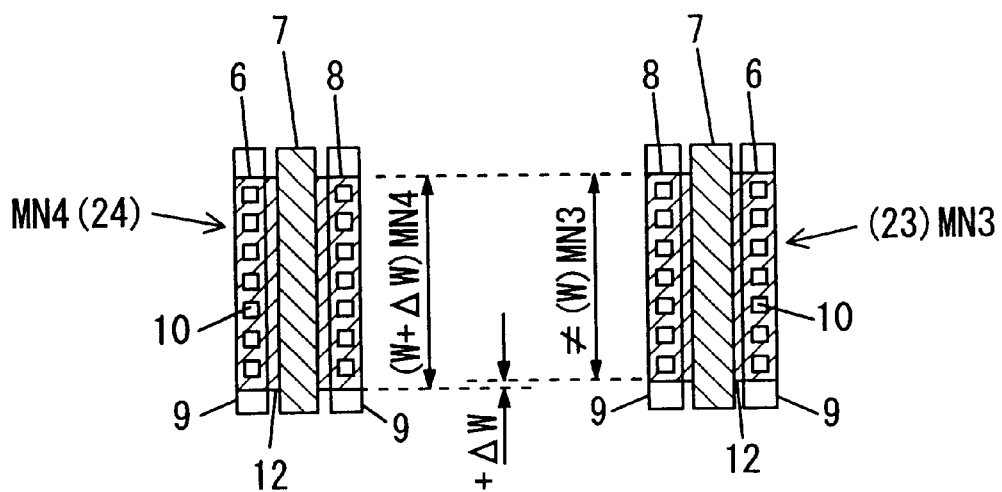
FIG. 26B is a diagram illustrating a layout of a MOS transistor in a case where a process error has occurred in the manufacturing process.

The N-channel transistor MN3 (23) illustrated in FIG. 24 as a conventional example includes one transistor. Therefore, when the channel width W is large, even if a gate contact is provided at one end of the gate so as to supply the gate potential via the gate contact, the gate potential attenuates at positions away from the gate contact due to the influence of a gate resistance component, when the frequency to be used with the transistor is a radio frequency on the order of GHz or higher. In such a case, the driving power lowers below the design value, and thermal noise occurs due to the resistance of the gate itself, thereby lowering the S/N ratio.

In the present embodiment, however, even if the N-channel transistor MN3 (23) has a large channel width W, the gate potential is applied for each of a number of N-type micro-unit transistors MUNSB (15), whereby it is possible to suppress the attenuation due to the gate resistance component. Therefore, even if the frequency to be used with the transistor is a radio frequency on the order of GHz or higher, it is possible to realize a driving power that is substantially equal to the design value. Moreover, at the same time, the gate resistance component is reduced, whereby the thermal noise lowers, and it is possible to increase the S/N ratio in a signal processing device using the analog MOS semiconductor device.

Note that the present invention is applied to the N-type micro-unit transistor MUNSB (15) in the example illustrated in FIG. 16, and examples where the N-type micro-unit transistor MUNSB (15) is used are illustrated in FIG. 17 to FIG. 20. Alternatively, the present invention may be applied to a P-type micro-unit transistor.

Moreover, while the gate wire 9 is an aluminum wire in the embodiments above, it may alternatively be a low-resistance wire such as a copper wire.

Sixth Embodiment

Next, the sixth embodiment of the present invention will be described with reference to FIG. 21.

Figure 21:
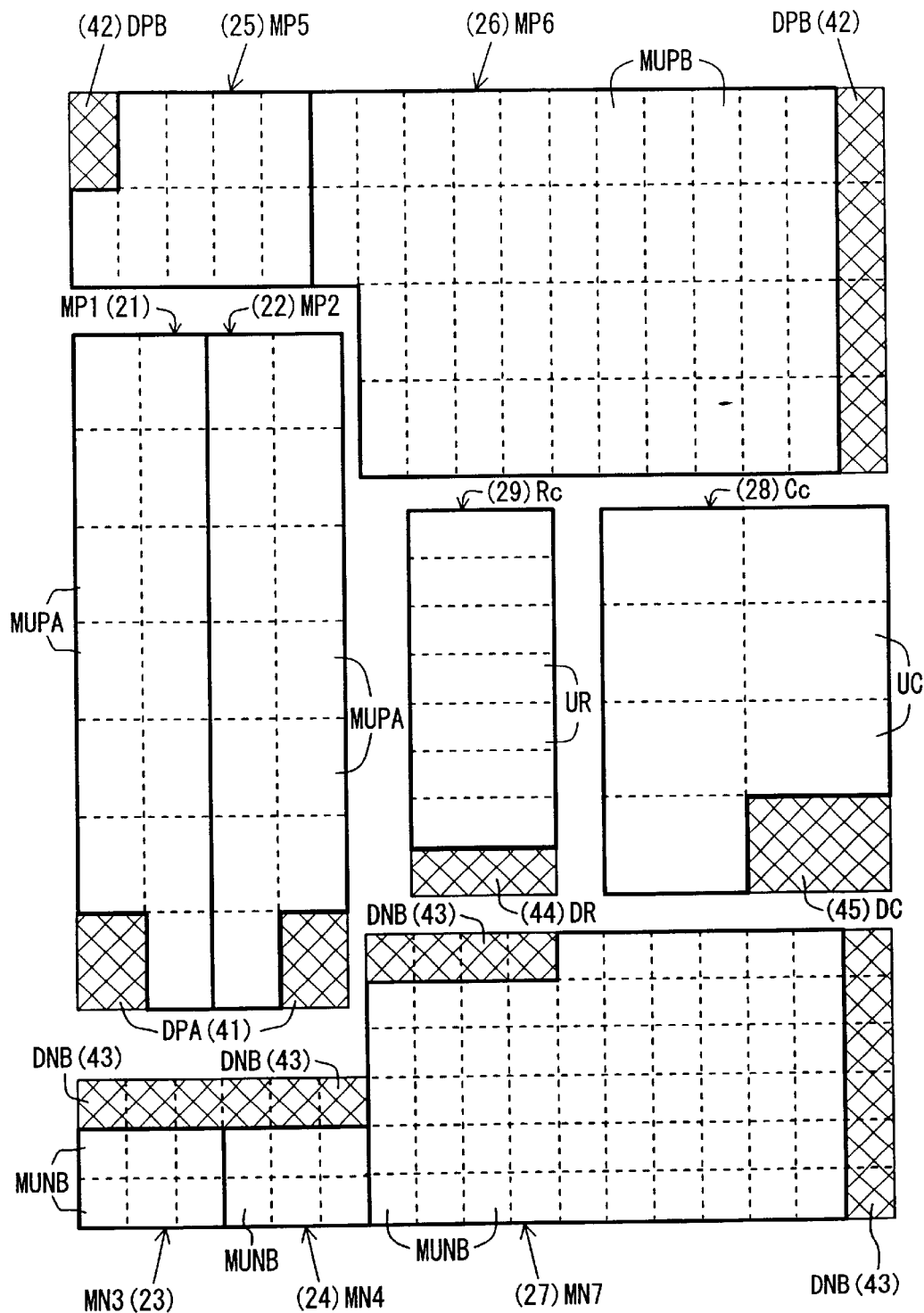
FIG. 21 is a diagram illustrating a layout of an operational amplifier according to the sixth embodiment of the present invention.

FIG. 21 illustrates a layout of an operational amplifier including dummy micro-unit transistors, a dummy resistor and a dummy capacitor in addition to the components of the operational amplifier illustrated in FIG. 6. The dummy components are hatched in FIG. 21. Referring to FIG. 21, each of the P-channel MOS transistors MP1 (21) and MP2 (22) of the operational amplifier additionally includes a dummy P-type micro-unit transistor DPA (41), being the same as the P-type micro-unit transistor MUPA, the P-channel MOS transistors MP5 (25) and MP6 (26) additionally include one and four, respectively, dummy P-type micro-unit transistor(s) DPB (42), each being the same as the P-type micro-unit transistor MUPB, and the N-channel MOS transistors MN3 (23), MN4 (24) and MN7 (27) additionally include three, three and ten, respectively, dummy N-channel micro-unit transistors DNB (43), each being the same as the N-type micro-unit transistor MUNB. Moreover, the resistor Rc additionally includes a dummy resistor DR (44), being the same as the unit resistor UR, and the capacitor Cc additionally includes a dummy capacitor DC (45), being the same as the unit capacitor UC. The dummy components are provided in unused areas.

Therefore, according to the present embodiment, in a case where a problem of a prototype analog semiconductor device is improved, if the channel width W of a transistor needs to be slightly increased in order to adjust the power of the transistor, the dummy micro-unit transistors DPA (41), DPB (42) and DNB (43) can be used as non-dummy micro-unit transistors only by modifying the wiring structure, thereby facilitating the adjustment of the power. Thus, if there is a wafer that has been put on hold in the manufacturing process immediately before the wiring step, such a wafer can be processed into another prototype using another mask that has been modified for the modified wiring structure. In this way, an intended analog MOS semiconductor device can be developed within a reduced period of time. Thus, the development time can be shortened according to the present invention.

Seventh Embodiment

Next, the seventh embodiment of the present invention will be described with reference to FIG. 22 and FIG. 23.

In the circuit configuration of an operational amplifier illustrated in FIG. 23, there are two pairs of transistors, i.e., a pair including the P-channel transistor MP1 (21) and the P-channel transistor MP2 (22), and another pair including the N-channel transistor MN3 (23) and the N-channel transistor MN4 (24).

Table 4 below shows an example where each of the four transistors MP1 (21), MP2 (22), MN3 (23) and MN4 (24), which form the two transistor pairs, includes a number of micro-unit transistors MUPA or MUNB that is a multiple of four. Table 4 also shows the number of unit transistors MUPB or MUNB included in the other transistors MP5, MP6 and MN7, the number of unit resistors UR included in the resistor Rc, and the number of unit capacitors UC included in the capacitor Cc, along with the channel width W and the channel length L of the transistors, the resistance value of the resistor and the capacitance value of the capacitor.

TABLE 4

|     | Unit × # | W (μm) | L (μm) |
| --- | --- | --- | --- |
| MP1 | MUPA × 16 | 160.00 | 1.00 |
| MP2 | MUPA × 16 | 160.00 | 1.00 |
| MN3 | MUNB × 8 | 40.00 | 0.50 |
| MN4 | MUNB × 8 | 40.00 | 0.50 |
| MP5 | MUPB × 10 | 100.00 | 0.50 |
| MP6 | MUPB × 45 | 450.00 | 0.50 |
| MN7 | MUNB × 72 | 720.00 | 0.50 |
| Rc | UR × 7 | 7.00 kΩ | |
| Cc | UC × 6 | 3.00 pF | |

Figure 22:
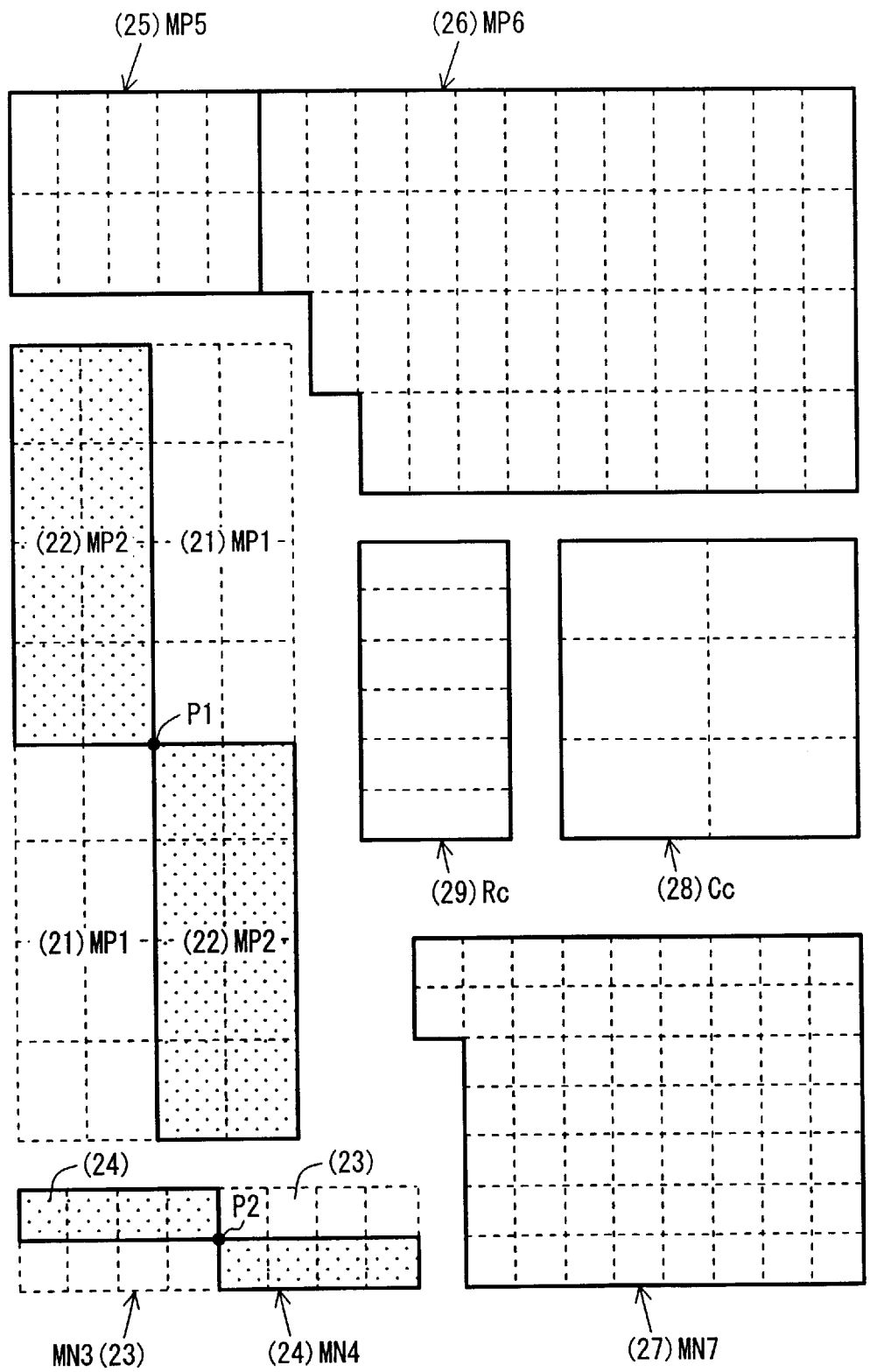
FIG. 22 is a diagram illustrating a layout of an operational amplifier according to the seventh embodiment of the present invention.

FIG. 22 illustrates a layout of the operational amplifier of FIG. 23 according to Table 4. In the figure, each meshed portion represents an area where a P-type micro-unit transistor MUPB included in the P-channel transistor MP2 (22) or an N-type micro-unit transistor MUNB included in the N-channel transistor MN4 (24) is provided.

In the present embodiment, as can be seen from FIG. 22, for each pair of transistors (MP1 (21) and MP2 (22)) and (MN3 (23) and MN4 (24)), the micro-unit transistors of the transistors are arranged in a centroid structure with respect to point P1 or P2 shown in the figure. Therefore, it is possible to effectively suppress the random offset voltage RVoff.

Eighth Embodiment

Figure 27:
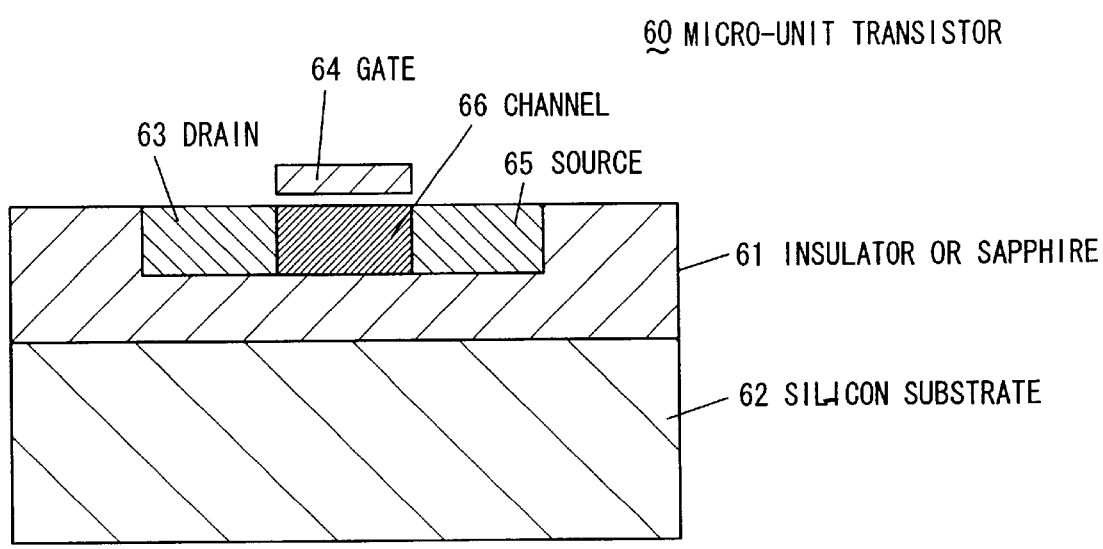
FIG. 27 is a diagram illustrating a structure of a micro-unit transistor according to the eighth embodiment of the present invention.

Next, an analog MOS semiconductor device according to the eighth embodiment of the present invention will be described with reference to FIG. 27.

A feature of the present embodiment is that a plurality of MOS transistors included in the analog MOS semiconductor device are formed in an SOI structure or an SOS structure. FIG. 27 illustrates an SOI (Silicon On Insulator) structure of a micro-unit transistor 60. Referring to FIG. 27, an insulator 61 is provided on a silicon substrate 62, with a drain 63 and a source 65 formed in an upper portion of the insulator 61, a channel 66 formed between the drain 63 and the source 65, and a gate 64 formed above the channel 66. In the SOI structure illustrated in FIG. 27, sapphire may be used in place of the insulator 61 so as to obtain an SOS (Silicon On Sapphire) structure.

Therefore, in the present embodiment, it is possible to realize an operation under an extremely low voltage and to reduce the influence of shot noise due to radioactive rays such as α rays. Furthermore, in a mixed semiconductor device including analog circuits and digital circuits integrated together, it is possible to reduce the influence of noise creeping in from the digital section.

Ninth Embodiment

Next, an analog MOS semiconductor device according to the ninth embodiment of the present invention will be described with reference to FIG. 28. In the description above, the present invention has been applied to the operational amplifier illustrated in FIG. 23 so as to realize systematic offset voltage SVoff=0 even if there is a process error. In the present embodiment, the present invention is applied to a bias voltage generation circuit, in which micro-unit transistors are used so that the ratio between two different bias voltages to be output is equal to a predetermined ratio.

Figure 28:
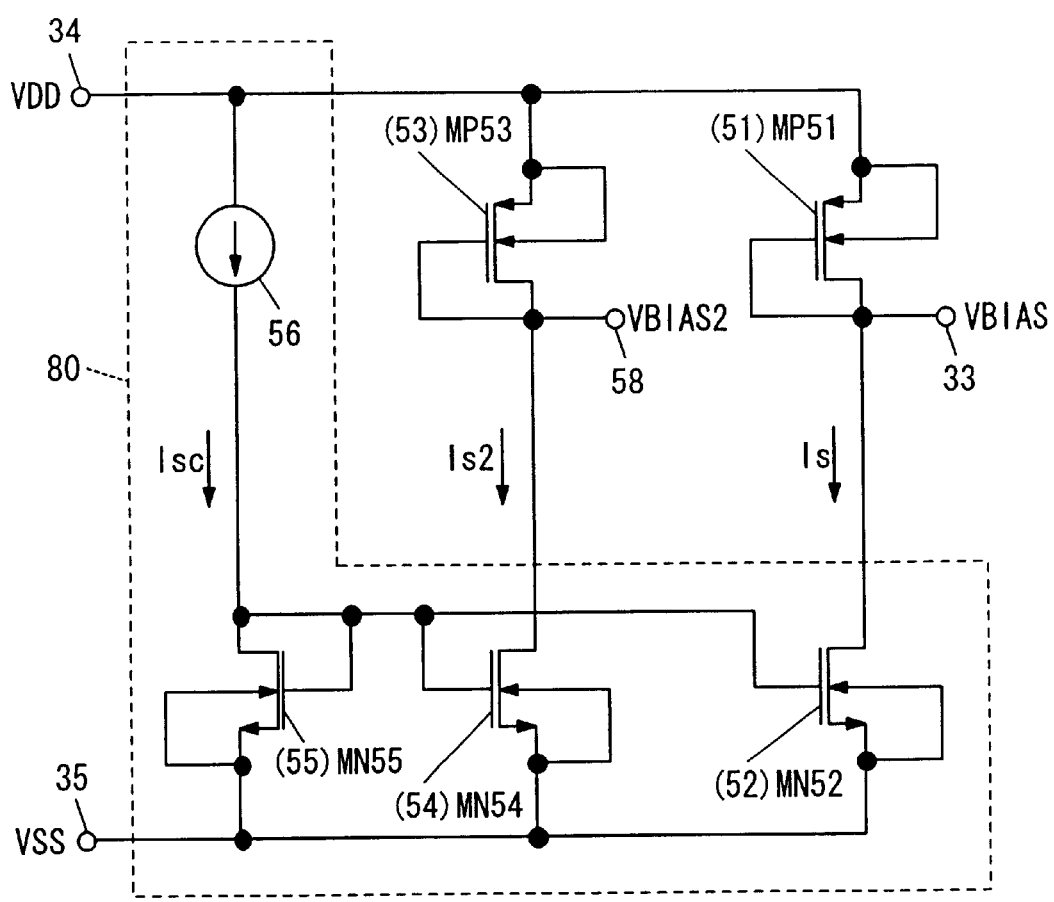
FIG. 28 is a diagram illustrating a bias voltage generation circuit according to the ninth embodiment of the present invention.

FIG. 28 illustrates a bias voltage generation circuit for generating a bias voltage VBIAS to be applied to the operational amplifier illustrated in FIG. 23. The bias voltage generation circuit includes a current mirror circuit 80, and two output transistors MP51 (51) and MP53 (53), each being a P-type MOS transistor. The output of the output transistor MP51 (51) is applied to the operational amplifier of FIG. 23 as the bias voltage VBIAS, and the output of the other output transistor MP53 (53) is applied to another operational amplifier as another bias voltage VBIAS2. The current mirror circuit 80 includes a constant current source 56 and three N-type MOS transistors MN52 (52), MN54 (54) and MN55 (55).

The channel width W and the channel length L of the five MOS transistors MP51 (51) to MN55 (55) are as shown in Table 5 below.

TABLE 5

|      | Unit × # | W ($\mu$m) | L ($\mu$m) |
|------|----------|------------|------------|
| MP51 | MUPB × 6 | 40.00      | 0.50       |
| MP53 | MUPB × 6 | 40.00      | 0.50       |
| MN52 | MUNB × 4 | 40.00      | 0.50       |
| MN54 | MUNB × 3 | 30.00      | 0.50       |
| MN55 | MUNB × 2 | 20.00      | 0.50       |

In a case where the design goal of the current mirror circuit 80 is to realize a ratio of 2:3:4 among a current Isc flowing through the N-type MOS transistor MN55 (55), a current Is2 flowing through the N-type MOS transistor MN54 (54), and a current Is flowing through the N-type MOS transistor MN52 (52), the three N-type MOS transistors MN55 (55), MN54 (54) and MN52 (52) of the current mirror circuit 80 are provided by respectively using two, three and four N-type micro-unit transistors MUNB, as shown in Table 5 above. In Table 5, each of the two P-type output transistors MP51 (51) and MP53 (53) is provided by using six P-type micro-unit transistors MUPB.

Therefore, in the present embodiment, each MOS transistor includes a number of P-type and N-type micro-unit transistors, whereby it is possible to set the current ratio at a predetermined ratio, and to suppress the random offset voltage RVoff to a low level even if a process error occurs.

Tenth Embodiment

Next, a program device according to the tenth embodiment of the present invention will be described with reference to FIG. 29.

Figure 29:
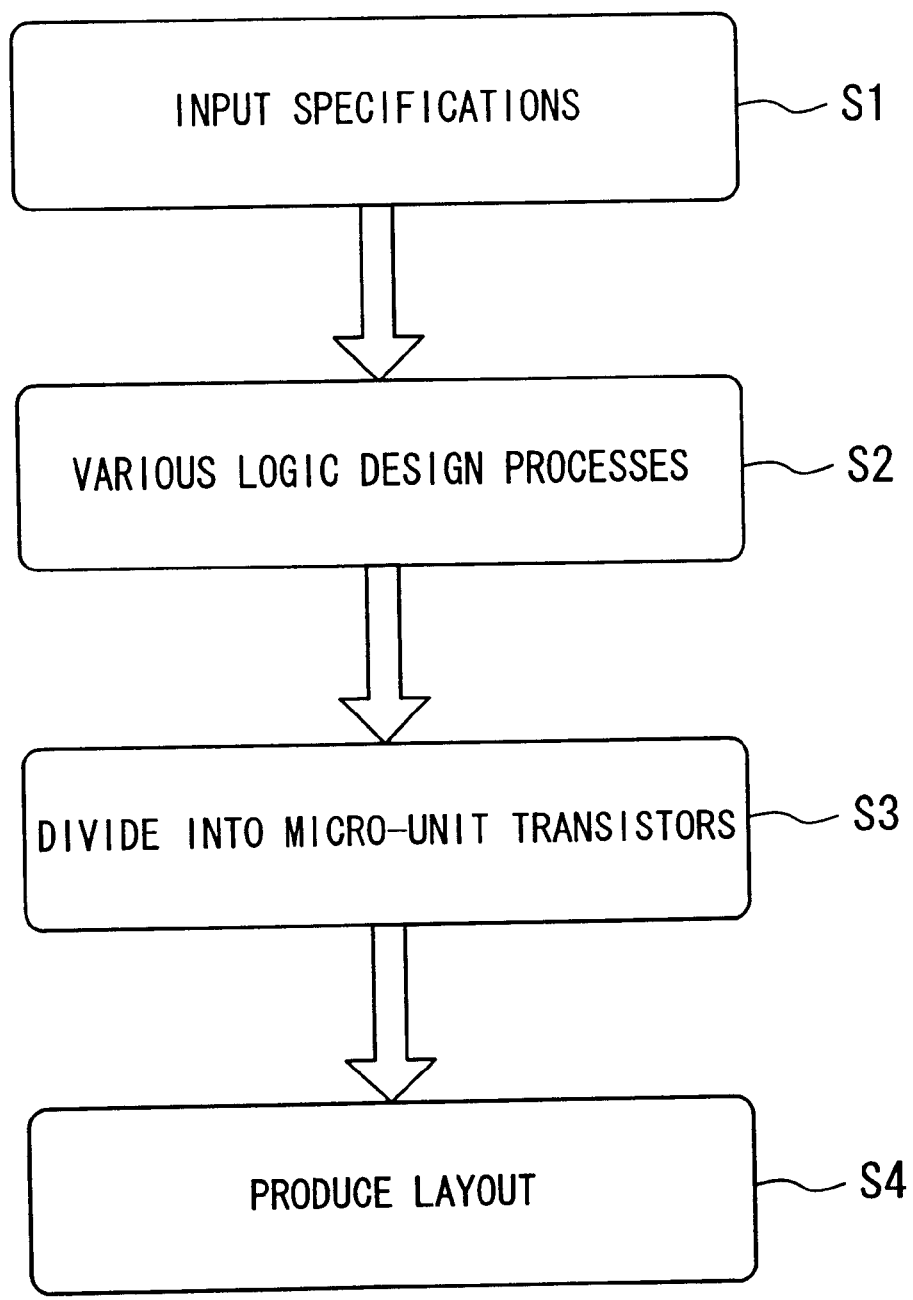
FIG. 29 is a diagram illustrating a design process for an analog MOS semiconductor device performed by a program device according to the tenth embodiment of the present invention.

FIG. 29 is a flow chart generally illustrating the process of manufacturing an analog MOS semiconductor device. FIG. 29 illustrates an EDA (Engineering Design Automation) function, or a CAD (Computer Aided Design) function for designing a layout of an analog MOS semiconductor device.

Referring to FIG. 29, in step S1, the specifications of an analog MOS semiconductor device to be manufactured are input. In step S2, various logic design operations are performed, such as the calculation of the driving power of each of a number of MOS transistors included in the semiconductor device, based on the specifications of the analog MOS semiconductor device. Then, in step S3, micro-unit transistors to be included in each of the number of MOS transistors are designed separately for P-type and for N-type, determining the channel width W and the channel length L for each of the micro-unit transistors, after which each of the number of MOS transistors is designed using a number of micro-unit transistors. Then, in step S4, the MOS transistors each including a number of micro-unit transistors are specifically laid out.

Thus, a feature of the present embodiment is to design an analog MOS semiconductor device by using a program having a function of calculating the number of micro-unit transistors to be used for each of different types of micro-unit transistors. In this way, miscalculations in the design process can be eliminated. Furthermore, the program device having an EDA function or a CAD function provides an easy-to-use man-machine interface, thereby reducing the development time and the development cost.

What is claimed is:

1. An analog MOS semiconductor device, comprising a plurality of MOS transistors, wherein:

a transistor having a channel width that is obtained by dividing, by an integer, a smallest channel width among those of the plurality of MOS transistors is used as a micro-unit transistor; and each of the plurality of MOS transistors includes a plurality of micro-unit transistors.

2. The analog MOS semiconductor device of claim 1, wherein:

the plurality of MOS transistors include two types of MOS transistors of P-type MOS transistors and N-type MOS transistors; and the micro-unit transistors include two types of micro-unit transistors of P-type micro-unit transistors and N-type micro-unit transistors.

3. The analog MOS semiconductor device of claim 2, wherein each of MOS transistors that are included in a conditional expression for realizing zero systematic offset voltage includes a number of micro-unit transistors that satisfies the conditional expression for realizing zero systematic offset voltage.

4. The analog MOS semiconductor device of claim 1, wherein the micro-unit transistors of each MOS transistor overlap with one another.

5. The analog MOS semiconductor device of claim 1, wherein:

each micro-unit transistor includes an even number of small transistors;

the even number of small transistors are connected in parallel to one another; and two of the even number of small transistors connected in parallel to one another that are located at opposite ends each have a source located at one end of the micro-unit transistor.

6. The analog MOS semiconductor device of claim 5, wherein:

the micro-unit transistor is a pair transistor including two small transistors connected in parallel to each other; and a source of one of the small transistors is located at one end of the pair transistor, and a source of the other one of the small transistors is located at the other end of the pair transistor.

7. The analog MOS semiconductor device of claim 1, 2, 3, 4, 5 or 6, wherein the micro-unit transistor includes a substrate contact via which one or more of electrodes of the micro-unit transistor is connected to a semiconductor substrate.

8. The analog MOS semiconductor device of claim 1, 2, 3, 4, 5 or 6, wherein the micro-unit transistor includes a gate contact connected to a gate of the micro-unit transistor, and a gate wire connected to the gate contact for applying a gate voltage to the gate.

9. The analog MOS semiconductor device of claim 1, 2, 3, 4, 5 or 6, wherein dummy micro-unit transistors are provided for adjusting a power of one or more of the plurality of MOS transistors.

10. The analog MOS semiconductor device of claim 9, wherein the dummy micro-unit transistors include two types of dummy micro-unit transistors of P-type dummy micro-unit transistors and N-type dummy micro-unit transistors.

11. The analog MOS semiconductor device of claim 1, 2, 3, 4, 5 or 6, wherein two MOS transistors forming a pair, among the plurality of MOS transistors, each include a number of micro-unit transistors that is a multiple of four.

12. The analog MOS semiconductor device of claim 1, 2, 3, 4, 5 or 6, wherein the plurality of MOS transistors have an SOI structure or an SOS structure.

13. A method for manufacturing an analog MOS semiconductor device including a plurality of MOS transistors, comprising the steps of:

preparing a plurality of micro-unit transistors each having a channel width that is obtained by dividing, by an integer, a smallest channel width among those of the plurality of MOS transistors; and manufacturing the plurality of MOS transistors using the plurality of micro-unit transistors so that each of the plurality of MOS transistors includes more than one of the micro-unit transistors.

14. The method for manufacturing an analog MOS semiconductor device of claim 13, wherein if the plurality of MOS transistors include two types of MOS transistors of P-type MOS transistors and N-type MOS transistors, two types of micro-unit transistors of P-type micro-unit transistors and N-type micro-unit transistors are prepared as the micro-unit transistors, so that each P-type MOS transistor includes more than one of the P-type micro-unit transistors and each N-type MOS transistor includes more than one of the N-type micro-unit transistors.

15. The method for manufacturing an analog MOS semiconductor device of claim 14, wherein when manufacturing MOS transistors that are included in a conditional expression for realizing zero systematic offset voltage, the number of micro-unit transistors to be included in each of the MOS transistors is set to be a number that satisfies the conditional expression for realizing zero systematic offset voltage.

16. A program for manufacturing an analog MOS semiconductor device including a plurality of MOS transistors, the program comprising the steps of:

defining, as a micro-unit transistor, a transistor having a channel width that is obtained by dividing, by an integer, a smallest channel width among those of the plurality of MOS transistors; and designing the plurality of MOS transistors so that each of the plurality of MOS transistors includes a plurality of micro-unit transistors.

17. A program device, comprising the manufacturing program of claim 16, wherein the program device has an EDA function or a CAD function for manufacturing an analog MOS semiconductor device including a plurality of MOS transistors based on the manufacturing program.

* * * * *